United States Patent
Hirano

(10) Patent No.: US 9,362,007 B2
(45) Date of Patent: *Jun. 7, 2016

(54) SEMICONDUCTOR MEMORY DEVICE

(71) Applicant: Samsung Electronics Co., Ltd., Suwon-si, Gyeonggi-do (KR)

(72) Inventor: Makoto Hirano, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 119 days.

This patent is subject to a terminal disclaimer.

(21) Appl. No.: 14/310,326

(22) Filed: Jun. 20, 2014

(65) Prior Publication Data

US 2014/0380116 A1 Dec. 25, 2014

(51) Int. Cl.
G11C 29/00 (2006.01)
G06F 11/16 (2006.01)
G11C 16/26 (2006.01)

(52) U.S. Cl.
CPC ............ G11C 29/78 (2013.01); G06F 11/1666 (2013.01); G11C 29/702 (2013.01); *G11C 16/26* (2013.01)

(58) Field of Classification Search
CPC ...... G11C 29/78; G11C 29/702; G11C 16/26; G11C 29/52; G11C 29/44; G06F 11/1666; G06F 11/1068; G06F 11/076
USPC ........................................................ 714/710
See application file for complete search history.

(56) References Cited

U.S. PATENT DOCUMENTS

| | | | | |
|---|---|---|---|---|
| 8,286,055 B2* | 10/2012 | Rho | ..................... | G06F 11/1048 365/230.08 |
| 8,355,289 B2* | 1/2013 | Kajigaya | .................. | G11C 8/08 365/189.09 |
| 2011/0231724 A1* | 9/2011 | Hara | .................... | G06F 11/1068 714/746 |
| 2014/0169092 A1* | 6/2014 | Miyamoto | ............. | G11C 16/26 365/185.09 |
| 2014/0380117 A1* | 12/2014 | Hirano | ................... | G11C 29/78 714/758 |

FOREIGN PATENT DOCUMENTS

JP 11-242899 9/1999

OTHER PUBLICATIONS

Pathak, S.; Tay, Y.C.; Qingsong Wei, "Power and endurance aware Flash-PCM memory system," in Green Computing Conference and Workshops (IGCC), 2011 International, vol., No., pp. 1-6, Jul. 25-28, 2011.*

Han-Lin Li; Chia-Lin Yang; Hung-Wei Tseng, "Energy-Aware Flash Memory Management in Virtual Memory System," in Very Large Scale Integration (VLSI) Systems, IEEE Transactions on, vol. 16, No. 8, pp. 952-964, Aug. 2008.*

(Continued)

*Primary Examiner* — Cynthia Britt
(74) *Attorney, Agent, or Firm* — Muir Patent Law, PLLC

(57) ABSTRACT

A data transfer unit includes a first page buffer to latch data of a normal bit line connected to a normal memory cell, a second page buffer to latch data of a parity bit line connected to a parity memory cell, and a third page buffer to be first replaced when the first page buffer is defective or when the second page buffer 102c is defective. An error code correction bus is connected to the first and second page buffers, and a data bus is connected to the first, second and third page buffers.

20 Claims, 25 Drawing Sheets

(56) References Cited

OTHER PUBLICATIONS

Cernea et al. "A 34 MB/s MLC Write Throughput 16 Gb NAND With All Bit Line Architecture on 56 nm Technology," in Solid-State Circuits, IEEE Journal of, vol. 44, No. 1, pp. 186-194, Jan. 2009.*

Tanakamaru, S.; Doi, M.; Takeuchi, K., "Unified solid-state-storage architecture with NAND flash memory and ReRAM that tolerates 32x higher BER for big-data applications," in Solid-State Circuits Conference Digest of Technical Papers (ISSCC), 2013 IEEE International, vol., No., pp. 226-227, Feb. 17-21, 2013.*

* cited by examiner

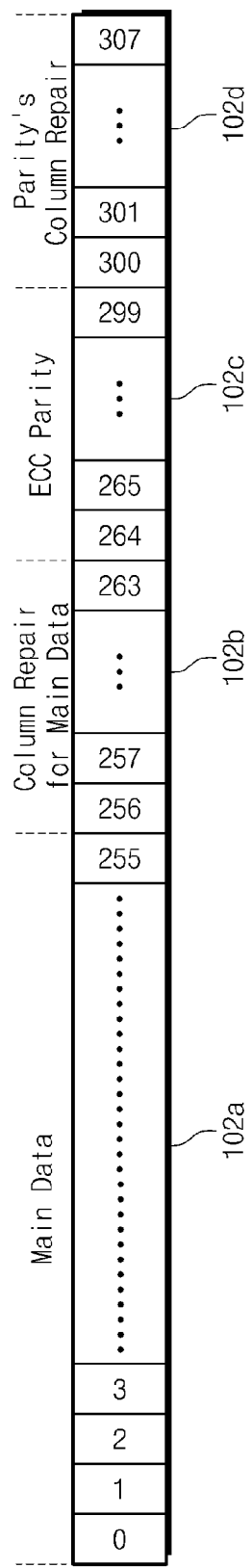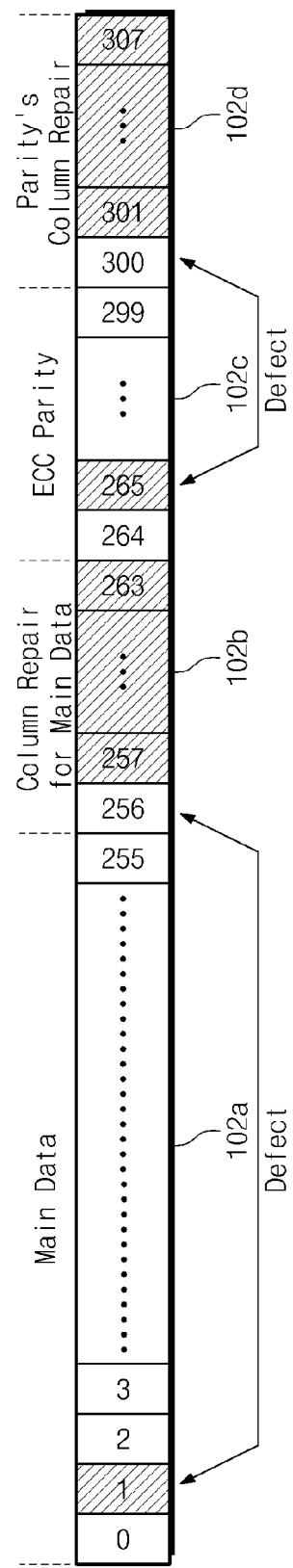

FIG. 13

| CR/PCR Setting<br>Operation Mode | CR | PCR |
|---|---|---|
| First Operation Mode<br>Sel_A:L, Sel_B:H | Data_In_A<br>Data_Out_A | Data_In_A<br>Data_Out_A |
| Second Operation Mode<br>Sel_A:H, Sel_B:L | Data_In_B<br>Data_Out_B | Data_In_A<br>Data_Out_A |

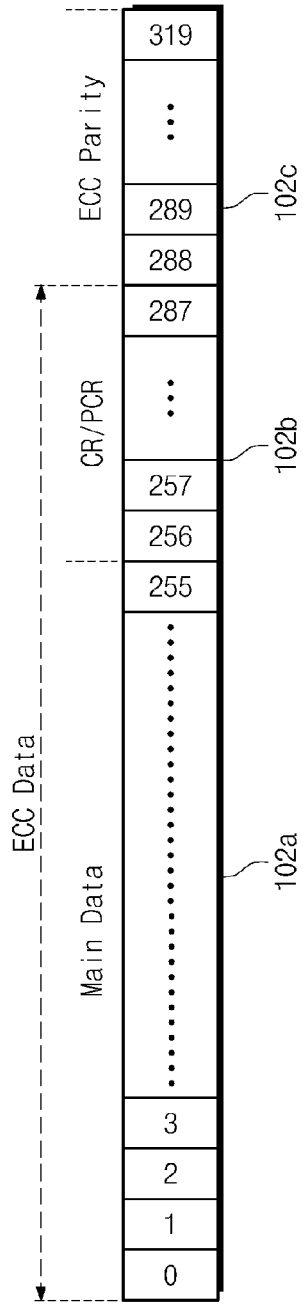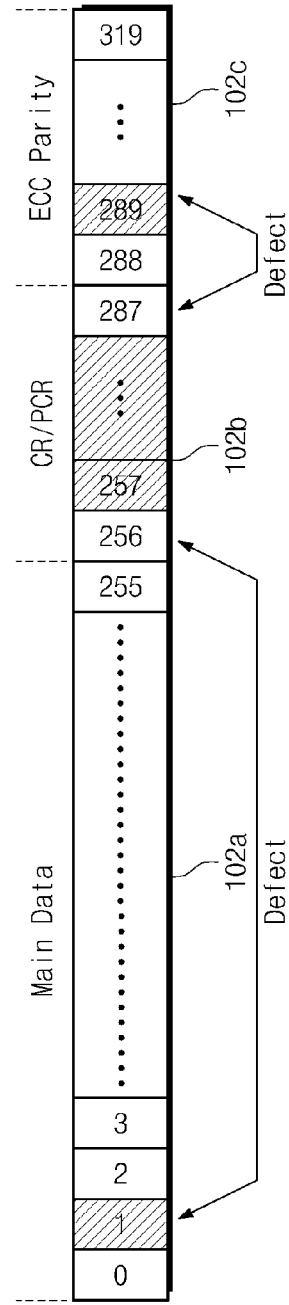

SEMICONDUCTOR MEMORY DEVICE

CROSS-REFERENCE TO RELATED APPLICATIONS

A claim for priority under 35 U.S.C. §119 is made to JP Application No. 2013-129548 filed Jun. 20, 2013 in the Japanese Patent Office, and to KR Application No. 2014-0062362 filed May 23, 2014 in the Korean Intellectual Property Office, the entire contents of which are hereby incorporated by reference.

BACKGROUND

1. Field

The present general inventive concepts described herein relate to a semiconductor memory device.

2. Description of the Related Art

In a conventional flash memory, a tunnel oxide layer deteriorates due to a plurality of write operations. Deterioration of the tunnel oxide layer causes a loss of a storage characteristic of a memory element (memory cell transistor) while data is stored therein, thereby increasing an error rate: a rate in which error bits are generated. In particular, in a NAND flash memory, the error rate may increase with an increase in a capacity of a memory cell, that is, scaling of a fabricating process. For this reason, at a write operation, redundancy data (parity data) of an error correcting code (ECC) (hereinafter, referred to as ECC redundancy data) is added to data to be stored, and resultant data is stored in a flash memory as a data stream. At a read operation, data that includes an error bit(s) is corrected using the ECC redundancy data. For example, a semiconductor memory device including an ECC circuit to perform ECC processing is disclosed in a patent reference 1 (Japanese Patent H11-242899).

Also, in the NAND flash memory, a test operation is performed just after fabrication to detect various cases: a bit fault that makes it impossible to store data, a short circuit that a bit line connected to a memory cell transistor is connected with another bit line, and a bit line open phenomenon. In these cases, data of a memory cell transistor is latched via a bit line, amplified, and output to an external device, or a set of a page buffer to write data at a memory cell, a bit line connected to the page buffer, and a memory cell transistor connected to the bit line is replaced with a defect-free set. To replace a defective set with a defect-free set is referred to as a redundancy technique. However, in the semiconductor memory device disclosed in the patent reference 1, a defective bit is repaired using ECC processing without replacing a defect using the redundancy technique. In this manner, however, a correction processing capacity of ECC processing to repair a memory cell transistor with no data storage characteristic due to its inherent aging is consumed to repair a defective bit due to a fabrication process, thereby lowering the correction processing capacity of ECC processing.

For the above-described reason, today, repairing a defective bit and correcting an error using ECC processing are made independently as will be described later.

FIG. 17 is a diagram schematically illustrating a typical block configuration of a NAND flash memory. In a NAND flash memory 80 illustrated in FIG. 17, a NAND controller (memory controller) 90 disposed outside of the NAND flash memory 80 executes ECC processing.

The NAND flash memory 80 in FIG. 17 contains a memory array 101, a page buffer 82, a column coding circuit 83, a column repair multiplexer (hereinafter, referred to as a column repair circuit) 84, and an I/O PAD 106.

Also, the NAND controller 90 has an ECC engine (ECC circuit) 87 and an I/O PAD 106c.

The memory array 101 includes a plurality of memory cell transistors, each of which stores 1-bit data. In the memory array 101, memory cell transistors connected to the same word line constitute a page. Data is written at or read from memory cell transistors in a page at the same time.

The page buffer 82 is configured to store data bits the number of which is equal to the number of memory cell transistors in a page of the memory cell array 101. FIG. 18 is a diagram illustrating a page buffer unit of a page buffer 82. Also, FIG. 19 is a diagram illustrating an internal circuit configuration of a conventional page buffer unit.

The page buffer 82 consists of a plurality of page buffer units, each of which is configured as illustrated in FIG. 18. The page buffer unit includes bit circuits $51\_0a$ to $51\_7a$, each of which is connected to one bit line and stores data read from a memory cell via a bit line or data to be written at a memory cell via the bit line.

When receiving a column address signal Sub BL Coding from a column coding circuit 83 illustrated in FIG. 17, a multiplexer $52\_b$ selects one of the bit circuits $51\_0a$ through $51\_7a$ based on a column address signal (DIO<i> in FIG. 19). That is, the multiplexer $52\_b$ connects one of eight bit lines to a PB control circuit $83\_1$.

Receiving a column address signal Coding from the column coding circuit 83 illustrated in FIG. 17, the PB control circuit $83\_1$ connects a bit circuit selected by the multiplexer $52\_b$ to a peripheral circuit via a data bus Data Bus_1.

With the above-described configuration, each memory cell transistor in a page is connected to a bit line of the page buffer 82 via a bit line. One, selected by a column address, from among the bit lines is connected to a data bus, so data is written at or read from a memory cell.

Returning to FIG. 17, the column coding circuit 83 generates the column address signals Sub BL Coding and Coding (refer to FIG. 18) based on a column address from an address control circuit (not illustrated) and selects a page buffer unit of the page buffer 82 corresponding to the column address signal. Accordingly, data is written at a memory cell transistor via the I/O pad 106, data buses Data Bus_2 and Data Bus_1, a bit circuit, and a bit line. Also, data is read from a memory cell via a bit line, a bit line, the data buses Data Bus_2 and Data Bus_1, and the I/O pad 106.

Also, the page buffer 82, as illustrated in FIG. 17, is formed of page buffers 82a and 82b. The page buffer 82a amplifies a potential of a bit line connected to a normal memory cell and latches the amplified result. The page buffer 82b is a page buffer that is replaced together with a normal memory cell and a bit line when a memory cell or a bit line connected to the page buffer 82a are defective. That is, if one of page buffer units of the page buffer 82a is defective, then it is repaired with one of page buffer units of the page buffer 82b.

The column repair circuit 84 is configured to repair a defective page buffer unit with a page buffer unit of the page buffer 82b. For example, the column repair circuit 84 controls the column coding circuit 83 when a column address indicating a location of a defective page buffer is received at a data read operation on a memory cell transistor. That is, under a control of the column repair circuit 84, a page buffer unit of the page buffer 82b is selected instead of a defective page buffer unit of the page buffer 82a. Thus, data in a selected page buffer unit is read out to a peripheral circuit via the data buses Data Bus_2 and Data Bus_1 and the I/O pad 106. A column address indicating a location of a defective page buffer includes repair information illustrated in FIG. 17. The repair information is detected via a semiconductor tester device (memory tester)

during a test operation after fabrication and then is stored in a system storage area of a memory array 101, for example, before shipping.

Meanwhile, when a column address indicating a location of a defective page buffer is received at a data write operation on a memory cell transistor, the column repair circuit 84 controls the column coding circuit 83 such that a page buffer unit of the page buffer 82*b* is selected instead of a defective page buffer unit of the page buffer 82*a*. Thus, data from the I/O pad is provided via the data buses Data Bus_2 and Data Bus_1 to a page buffer unit of the page buffer 82*b*, not a defective page buffer unit.

The data buses Data Bus_1 and Data Bus_2 are wirings to transfer data between the page buffer 82 and the I/O pad 106 and are formed of 8 or 16 lines. The I/O pad (or, interface unit) 106 is an external terminal to transfer data between the NAND flash memory 80 and the NAND controller 90.

An I/O pad (or, interface unit) 106*c* of the NAND controller 90 is an external terminal to transfer data between the NAND flash memory 80 and the NAND controller 90.

At a data read operation of the NAND flash memory 80, the ECC engine (ECC circuit) 87 receives data (including data before repairing, but probability that the data includes an error exists) from the NAND flash memory 80 via the I/O pad (or, interface unit) 106*c*. The ECC circuit 87 performing ECC processing (decode processing) on the received data based on, for example, parity data stored therein and outputs clear data after error correction to an external device. Meanwhile, at a data write operation of the NAND flash memory 80, the ECC circuit 87 generates parity data from data received from an external device and 1-page data of the NAND flash memory 80 before the received data is written. The ECC circuit 87 stores the parity data therein and outputs write-in data to the NAND flash memory 80 via the I/O pad (or, interface unit) 106*c*.

As described above, in a typical NAND flash memory, ECC processing is executed at an external device. For this reason, data when the ECC processing is performed is data that passes through the column repair circuit 84, that is, data after defective column repairing.

A time for the ECC processing is required because the NAND flash memory 80 sends data only using a bus width of the I/O pad 106 at the ECC processing. To widen a bus width at the ECC processing is considered to shorten a time for the ECC processing. For example, there is considered to widen bus widths of the data buses Data Bus_1 and Data Bus_2 of the NAND flash memory 80.

However, if a bus width is doubled, the size of the column repair circuit 84 is also doubled to maintain a repair efficiency of defective bits constantly, that is, because of the probability that the number of defective bits input and repaired in the column repair circuit 84 is double the number of defective bits before a bus width is widened. Also, the circuit size of the I/O pad 106, for example, the number of pads disposed may increase. With the above description, if a bus width is widened for high-speed ECC processing, a chip size increases to repair defective bits.

Or, the ECC circuit 87 for ECC processing can be configured to be placed in the NAND flash memory 80. For example, there may be considered a semiconductor memory device which uses a part of outputting clear data as an I/O pad by eliminating the I/O pads 106 and 106*c* with the NAND flash memory 80 and the NAND controller 90 integrated. In this case, if a bus width is widened for high-speed ECC processing, a chip size increases to repair defective bits. Furthermore, since data input in the ECC circuit 87 is data after repairing of defective bits, that is, data passing through the column repair circuit 84, a time for the ECC processing increases as long as a time taken to repair defective bits via the column repair circuit 84.

SUMMARY

The present general inventive concept provides a semiconductor memory device to prevent an increase in a size of a column repair circuit to repair a defective page buffer connected to a normal memory cell or bit line with a defect-free page buffer and to transfer data to an error correcting code (ECC) circuit at a high speed.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing a semiconductor memory device including a first data bus, a second data bus being independent from the first data bus, the number of lines of the first data bus being different from that of the second data bus, and a data transfer unit which transfers data by connecting the first data bus with bit lines, the number of which is equal to the number of lines of the first data bus, from among a plurality of bit lines when data is transferred at least one of to and from memory cells during a first operation mode and transfers data by connecting the second data bus with bit lines, the number of which is equal to the number of lines of the second data bus, from among the plurality of bit lines when data is transferred to/from memory cells during a second operation mode, wherein the data transfer unit includes a first page buffer to latch data of a normal bit line connected to a normal memory cell, a second page buffer to latch data of a parity bit line connected to a parity memory cell; and a third page buffer that is replaced together with a normal memory cell and a normal bit line when a normal memory cell or a normal bit line connected to the first page buffer is defective or is replaced together with a parity memory cell and a parity bit line when a parity memory cell or a parity bit line connected to the second page buffer is defective, wherein the first data bus is connected to the first and third page buffers and the second data bus is connected to the first, second, and third page buffers.

The third page buffer may previously store identification data indicating whether either one of the first and second page buffers is replaced and operates as the first page buffer or the second page buffer in response to the identification data.

The semiconductor memory device may further include an ECC circuit which corrects an error of output data of the first page buffer input in a data input/output unit connected to the first data bus based on output data of the second page buffer input in a parity data input/output unit connected to the second data bus, and a repair circuit which is connected to the second data bus and repairs a page buffer, associated with a defective memory cell or bit line, of the first page buffer at the second operation mode, wherein when the identification data of the third page buffer indicates that a repair target of the second page buffer is repaired, the repair circuit selects the second page buffer as the repair target at the first operation mode and converts a first selection address of the first operation mode into a second selection address of the second operation mode when the first selection address is received, wherein the second selection address converted is compared with a second selection address of a second operation mode predetermined with respect to the second page buffer, wherein when the comparison result indicates "Hit", the third page buffer as a repair place is connected to the second data bus, and wherein the third page buffer as a repair place outputs fixed data to the first data bus and parity data to the second data bus at a data read operation of the first operation mode, and at a data write operation of the first operation mode, writing of parity data from the second data bus is allowed and writing of data from the first data bus is inhibited.

The first page buffer may include a page buffer control circuit to set an output of a page buffer, connected to a defective memory cell or bit line, to fixed data and the page buffer control circuit inhibits an input from the first data bus when a memory cell or a bit line is defective.

The foregoing and/or other features and utilities of the present general inventive concept may also be achieved by providing a semiconductor memory device including a data transfer unit including a first page buffer to store normal data, a second page buffer to store parity data, and a third page buffer operating as a selected page buffer unit in the first and second page buffers to act as a shared page buffer at a repair operation on a defective column, and a repair circuit used in common when a defective page buffer unit in the first and second page buffers is repaired with a page buffer unit in the third page buffer.

The semiconductor memory device may further include an ECC circuit to correct an error of output data of the first page buffer input in a data input/output unit connected to a first data bus connected with the first and third page buffers, based on output data of the second page buffer input in a parity data input/output unit connected to a second data bus independent of the first data bus.

In the third page buffer may be previously written identification data indicating whether a page buffer unit of either one of the first and second page buffers is repaired.

The repair circuit may include an address comparison unit which selects the second page buffer at a first operation mode and converts a first selection address of the first operation mode into a second selection address of a second operation mode, when the identification data of the third page buffer indicates that the second page buffer is used as a repairing placed, and a data bus switching unit which enables the third page buffer to output fixed data to the first data bus and parity data to the second data bus at a data read operation of the first operation mode and enables the third page buffer to inhibit data writing from the first data bus and to allow writing of parity data from the second data bus at a data write operation of the first operation mode.

The address comparison unit may include an address comparison circuit to compare the first selection address with stored defect bit information and generate a column repair hit signal when the first selection address corresponds to the stored defect bit information, and an address conversion circuit to convert the first selection address received at the first operation mode into the second selection address of the second operation mode.

The repair circuit, during a first operation mode, may connect first bit lines of a plurality of bit lines to the first data bus such that data is transferred, the number of the first bit lines being equal to the number of bus lines of the first data bus, and wherein the repair circuit, during a second operation mode, connects second bit lines of the plurality of bit lines to the second data bus such that data is transferred, the number of the second bit lines being equal to the number of bus lines of the second data bus that is independent of the first data bus.

The second data bus may be connected to the first and third page buffers.

The third page buffer may be repaired together with a normal memory cell and a normal bit line when the normal memory cell or the normal bit line connected to the first page buffer is defective, and wherein the third page buffer may be repaired together with a parity memory cell and a parity bit line when the parity memory cell or the parity bit line connected to the second page buffer is defective.

The first data bus may be an ECC bus.

The number of buses of the second data bus may be more than that of the ECC bus.

The number of page buffer units in the third page buffer may be less than that of the second page buffer.

The repair circuit may repair a page buffer unit of the first page buffer, associated with a defective memory cell or a defective bit line, with a buffer unit of the third page buffer during the second operation mode.

The first page buffer may include a page buffer control circuit to set an output of a page buffer, connected to a defective memory cell or bit line, to fixed data, and wherein the page buffer control circuit inhibits writing from the first data bus when a memory cell or a bit line is defective.

The third page buffer may include a repair information storing unit to store identification data indicating whether a page buffer unit of either one of the first and second page buffers is repaired.

The semiconductor memory device may further include a column repair selecting unit to connect the buffer unit of the third page buffer to an ECC data bus to perform a read or an ECC data bus to perform a write in response to the identification data.

The foregoing and/or other features and utilities of the present general inventive concept may also be achieved by providing a semiconductor memory device, including a data transfer unit including a first page buffer to store normal data, a second page buffer to store parity data, and a third page buffer that is replaced together with one of normal data when the stored normal data is defective and parity data when the stored parity data is defective, and a repair circuit used in common when a defective page buffer unit in the first and second page buffers is repaired with a page buffer unit in the third page buffer.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIGS. 8A-8C are diagrams describing each page buffer of a page buffer;

FIG. 13 is a diagram describing how data is exchanged using either one of Data Bus and ECC Bus, based on data retained in a CR/PCR information storing unit;

FIGS. 14A-14B are diagrams describing each page buffer of a page buffer of a NAND flash memory;

DETAILED DESCRIPTION OF THE PREFERRED EMBODIMENTS

Figure 1:
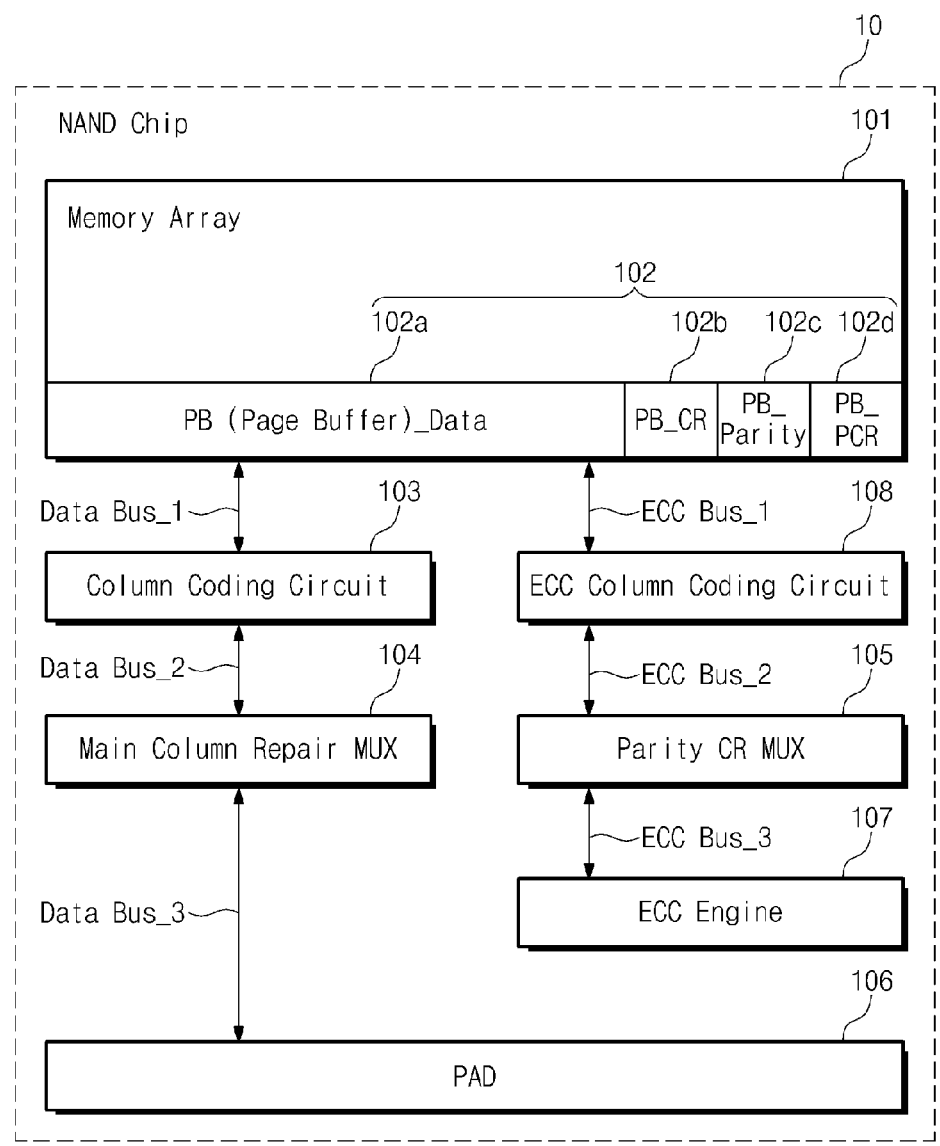
FIG. 1 is a diagram schematically illustrating a block configuration of a NAND flash memory.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a NAND flash memory 10. Referring to FIG. 1, a NAND flash memory 10 incorporates a memory array 101, a page buffer 102, a column coding circuit 103, and a main column repair multiplexer (MUX) 104. The NAND flash memory 10 may further include a parity column repair circuit (a.k.a., parity CR MUX) 105, an error correction code (ECC) column coding circuit 108, an input/output (I/O) pad 106, and an ECC circuit (a.k.a., ECC engine) 107. In FIG. 1, components that are identical to those of a NAND flash memory 80 illustrated in FIG. 17 are marked by the same reference numerals, and a description thereof is thus omitted.

In FIG. 1, Data Bus_1, Data Bus_2, and Data Bus_3 (second data bus) are wirings to transfer data between the page buffer 102 and the I/O pad 106 and are named "Data_Bus" later. Also, ECC Bus_1, ECC Bus_2, and ECC Bus_3 are wirings to transfer data between the page buffer 102 and the ECC engine 107 and are named "ECC_Bus" later.

Figure 17:
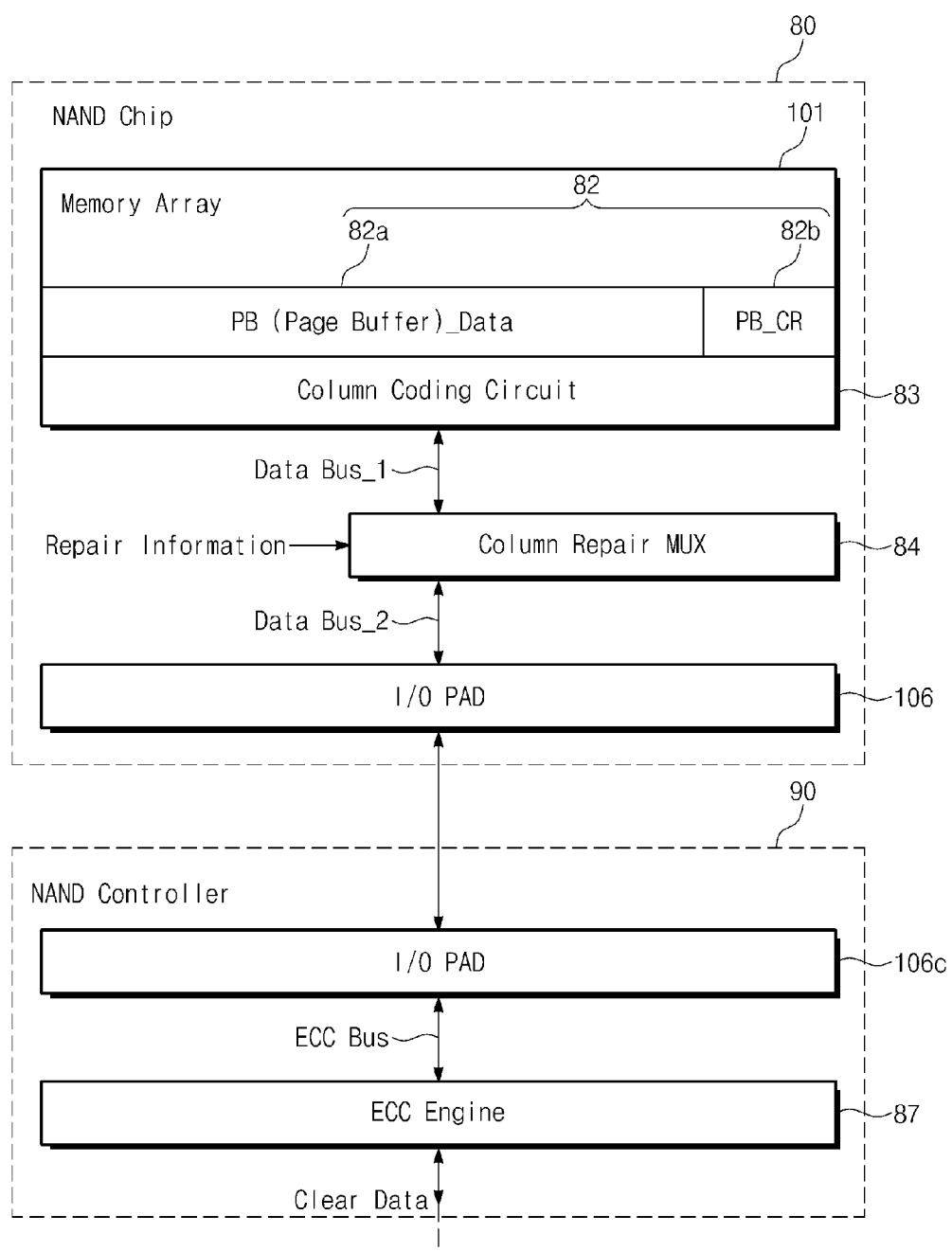
FIG. 17 is a diagram schematically illustrating a typical block configuration of a NAND flash memory.
Figure 18:
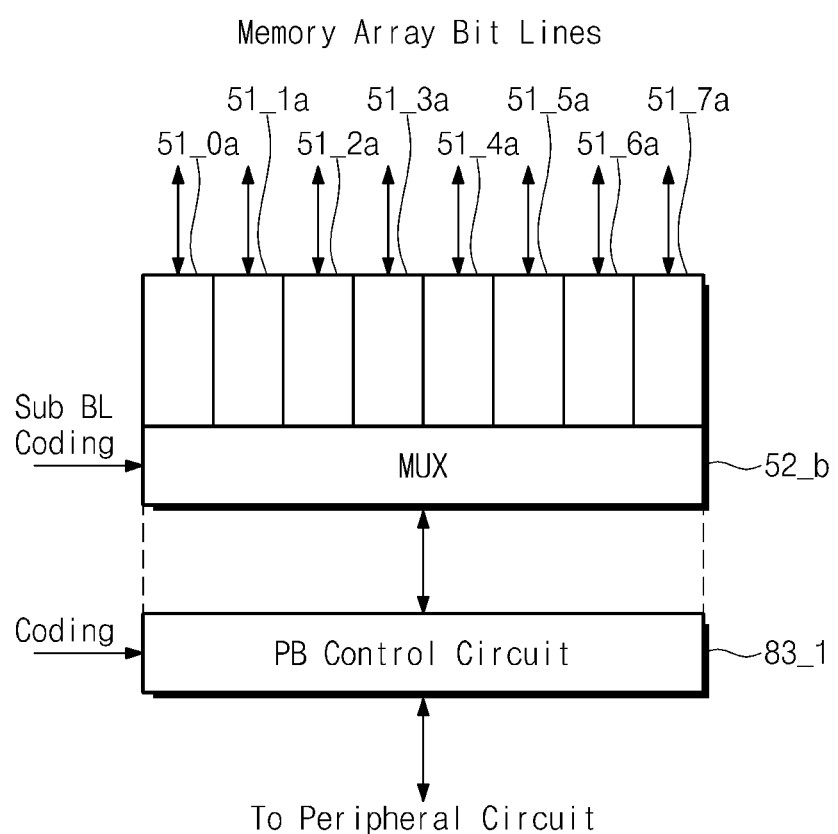
FIG. 18 is a diagram describing a page buffer unit of a page buffer.
Figure 19:
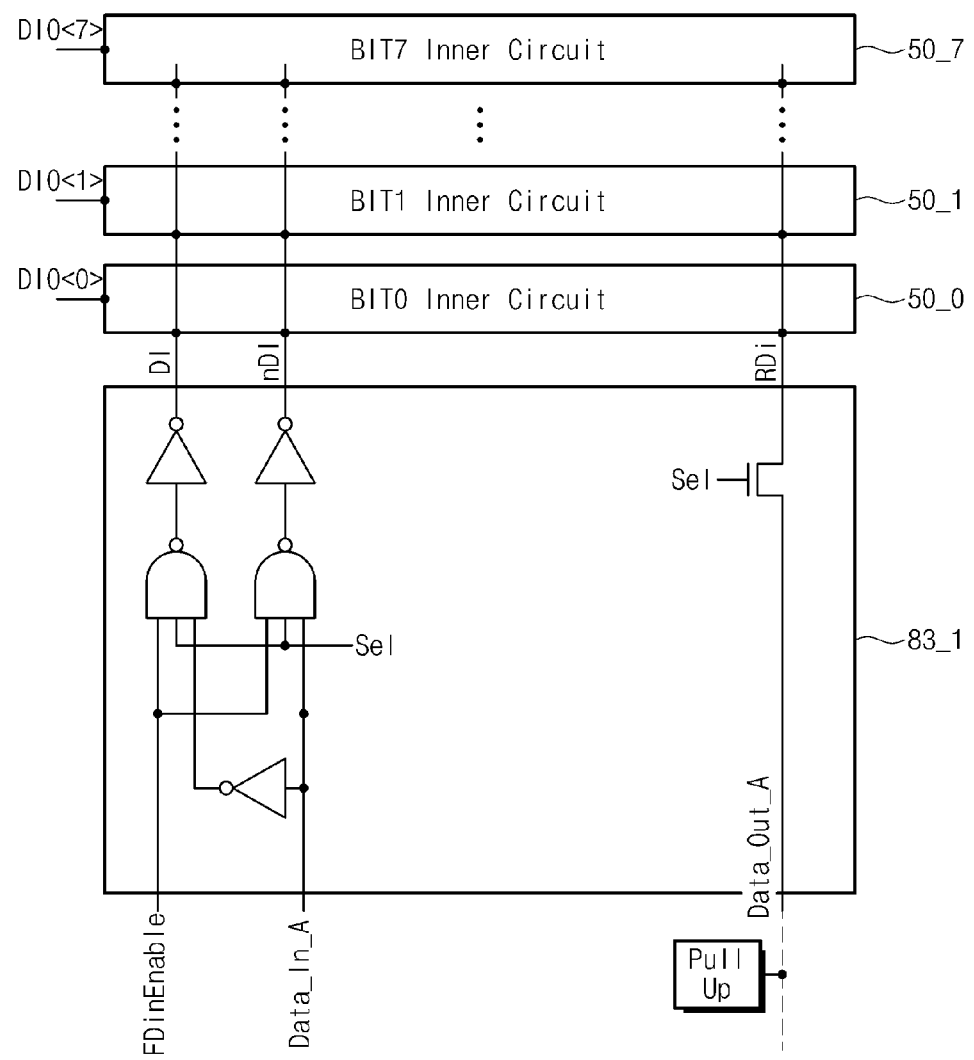
FIG. 19 is a diagram schematically illustrating an internal circuit configuration of a conventional page buffer unit.

Unlike a NAND flash memory 80 illustrated in FIG. 17, the NAND flash memory 10 includes the column coding circuit 103 and the ECC column coding circuit 108 instead of a column coding circuit 83. The column coding circuit 103 and the ECC column coding circuit 108 may be supplied with individual column addresses Coding. The column coding circuit 103 and the ECC column coding circuit 108 output a selection signal Sel_A or a selection signal Sel_B to a PB control circuit 60 of the page buffer 102 such that an output of a page buffer is connected to one of ECC Bus_1 and Data Bus_1 from a portion (corresponding to a multiplexer 52_b and a PB control circuit 83_1 illustrated in FIG. 18) directly connected to the page buffer 102.

In particular, the ECC column coding circuit 108 receives a column address Address B from the ECC circuit 107. The ECC column coding circuit 108 outputs a selection signal Sel_B to the PB control circuit 60 independently from a column address Address A provided to the column coding circuit 103 from an address control circuit (not illustrated), so an output of the page buffer 102 is connected to ECC Bus_1. An address control to connect an output of the page buffer 102 and ECC Bus_1 or Data Bus_1 may be made independently.

In a conventional NAND flash memory, also, an output of the page buffer (hereinafter, naming a data bus an IO bus) is shared at a first operation mode and a second operation mode. In contrast, in the NAND flash memory 10, the IO bus an output of the page buffer is independent at the first operation mode and the second operation mode, not shared.

Thus, a circuit that affects a high-speed data transfer of a column repair circuit 104 (to be described later) is unnecessary on a path ranging from an output of the page buffer to the ECC circuit 107, thereby implementing a high-speed data transfer. Also, a second data bus may have a bus width corresponding to conventional repair efficiency. By this, a circuit size of the column repair circuit 104 does not increase, thereby preventing an increase in a chip size. Furthermore, the ECC column coding circuit 108, the parity column repair circuit 105, ECC Bus_1 to ECC Bus_3, and the ECC circuit 107 may be eliminated even through the NAND flash memory 10 is changed into a NAND flash memory that does not include an ECC circuit. Thus, it is easy to design a flash memory.

The page buffer 102, as illustrated in FIG. 1, includes PB_Data, PB_CR, PB_Parity, and PB_PCR (hereinafter, referred to as page buffers 102a, 102b, 102c, and 102d, respectively).

The page buffer 102a amplifies a potential of a bit line connected to a normal memory cell and latches an amplified result. When a selection signal Sel_A is received from the column coding circuit 103 at a data read operation of a normal mode (second operation mode), the page buffer 102a outputs the amplified result to the I/O pad 106 as a data-out signal Data_Out_A via Data Bus_1, Data Bus_2, and Data Bus_3 (second data bus).

Meanwhile, when a selection signal Sel_B is received from the column coding circuit 103 at a data read operation of an ECC mode (first operation mode), the page buffer 102a outputs the amplified result to the I/O pad 106 as a data-out signal Data_Out_B via ECC Bus_1, ECC Bus_2, and ECC Bus_3 (first data bus).

Also, when the selection signal Sel_A is received from the column coding circuit 103 at a data write operation of the normal mode, the page buffer 102a receives write-in data from the I/O pad 106 via Data Bus_3, Data Bus_2, and Data Bus_1 as a data-in signal Data_In_A. Meanwhile, when the selection signal Sel_B is received from the ECC column coding circuit 108 at a data write operation of the ECC mode, the page buffer 102a receives an output of the ECC circuit 107 via ECC Bus_3, ECC Bus_2, and ECC Bus_1 as a data-in signal Data_In_B.

The page buffer 102b is a page buffer that is repaired together with a normal memory cell and a bit line when a normal memory cell or bit line connected to the page buffer 102a is defective. That is, if one of page buffer units of the page buffer 102a is defective, it is repaired with one of page buffer units of the page buffer 102b. In addition, an operation of the page buffer 102b is the same as that of the page buffer 102a, and a description thereof is thus omitted.

To replace a page buffer unit of the page buffer 102a with that of the page buffer 102b may be made by the column repair circuit 104. Where a column address (selection signal Sel_A) to select a defective page buffer unit of the page buffer 102a is received, the column repair circuit 104 executes a control such that the column coding circuit 103 selects a page buffer unit of the page buffer 102b.

The page buffer 102c amplifies a potential of a bit line connected to a parity memory cell (memory cell transistor to perform ECC processing having the same configuration as a normal memory cell) and latches an amplification result. In addition, parity data that a parity memory cell stores is not output to an external device via the I/O pad 106 at a normal mode. Meanwhile, receiving a selection signal Sel_B from ECC column coding circuit 108 at a data read operation of the ECC mode, the page buffer 102c outputs the amplification result to the ECC circuit 107 via the ECC Bus_1, ECC Bus_2, and ECC Bus_3 as a data-out signal Data_Out_B.

Also, parity data that a parity memory cell stores is not received from an external device via the I/O pad 106 at a normal mode.

Meanwhile, receiving a selection signal Sel_B from the ECC column coding circuit 108 at a data write operation of the ECC mode, the page buffer 102c receives parity data being an output of the ECC circuit 107 as a data-in signal Data_In_B via the ECC Bus_3, ECC Bus_2, and ECC Bus_1.

The page buffer 102d is a page buffer that is replaced together with a parity memory cell and a bit line when a parity memory cell or bit line connected to the page buffer 102c is defective. That is, if a page buffer unit of page buffer units of the page buffer 102c is defective, it is replaced with a page buffer unit of the page buffer 102d. In addition, an operation of the page buffer 102d is the same as that of the page buffer 102c, and a description thereof is thus omitted.

The parity column repair circuit 105 may repair a page buffer unit of the page buffer 102c with that of the page buffer 102d. If a column address (selection signal Sel_B to be described later) to select a defective page buffer unit of the page buffer 102c is received, the parity column repair circuit 105 executes a control such that the ECC column coding circuit 108 selects a page buffer unit of the page buffer 102d.

Figure 2:
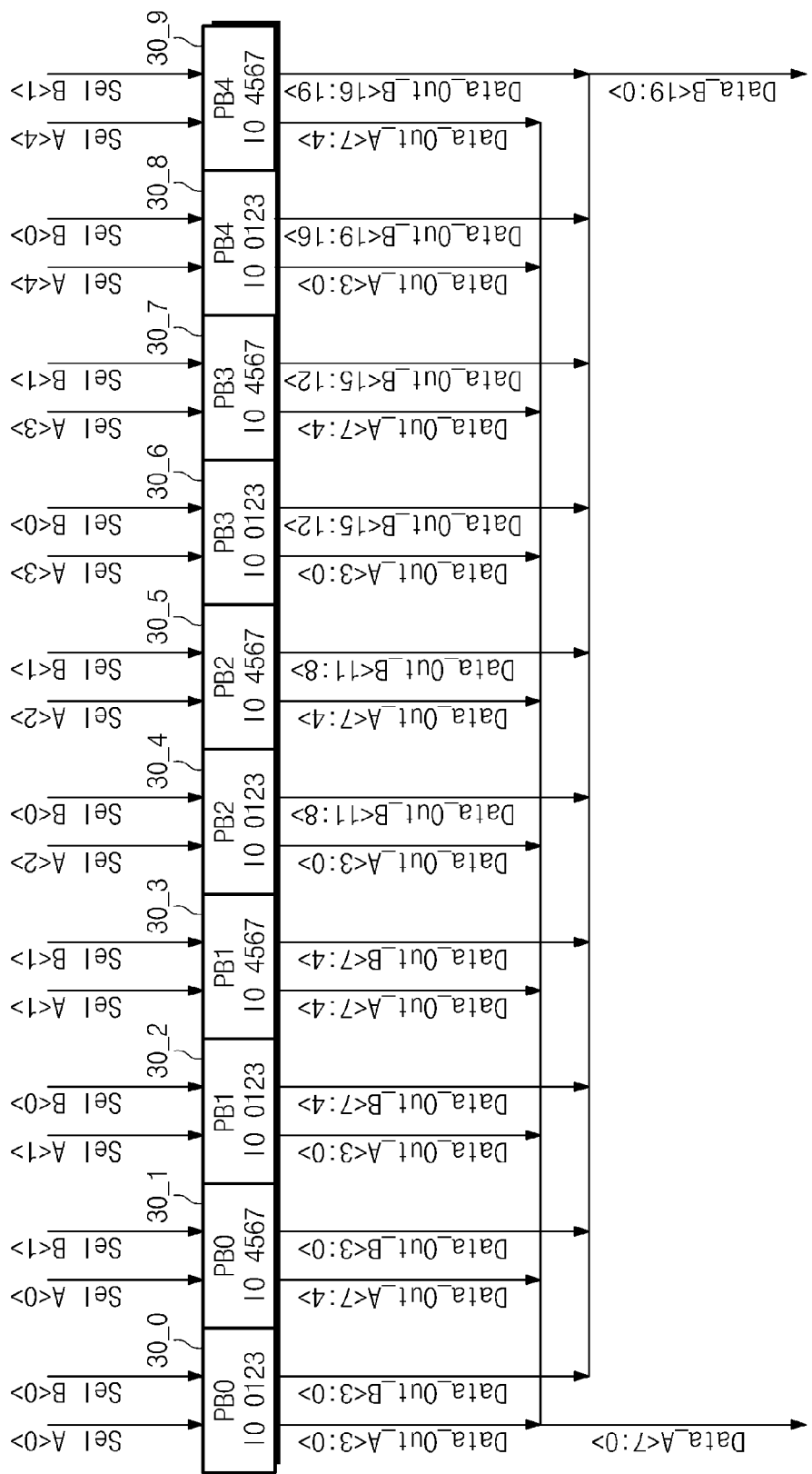
FIG. 2 is a diagram describing a data read operation of a portion corresponding to a page buffer, a column coding circuit, and an ECC column coding circuit illustrated in FIG. 1.
Figure 3A:
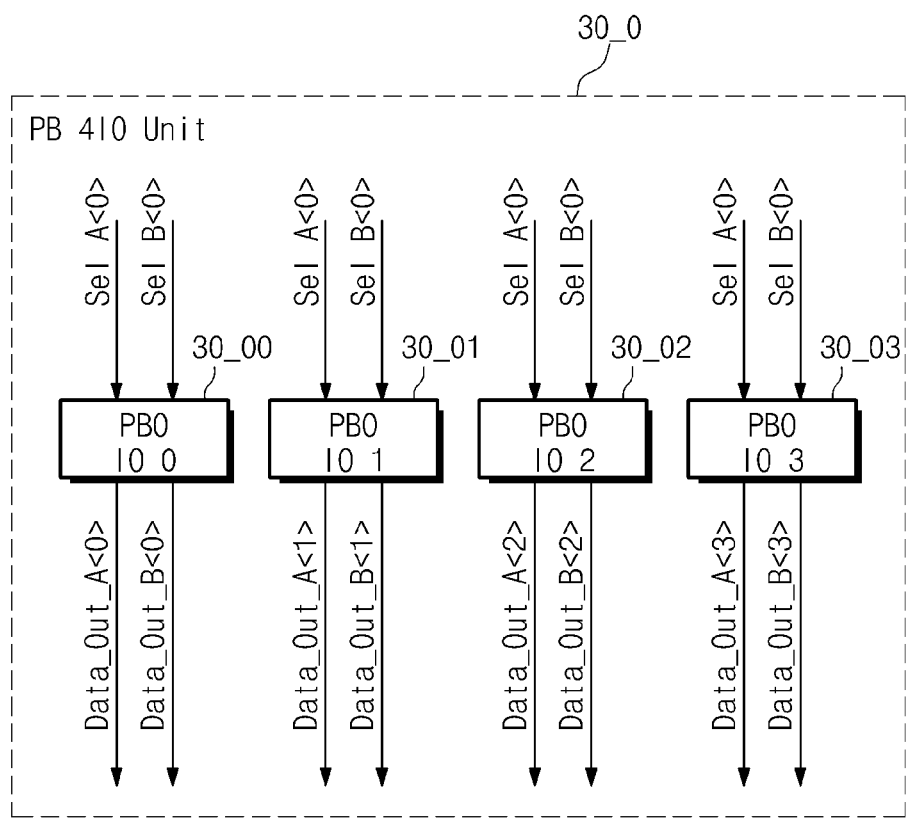
FIGS. 3A-3B are diagrams schematically illustrating an internal configuration of a PB unit and an internal configuration of a PB 4IO unit illustrated in FIG. 2.
Figure 3B:
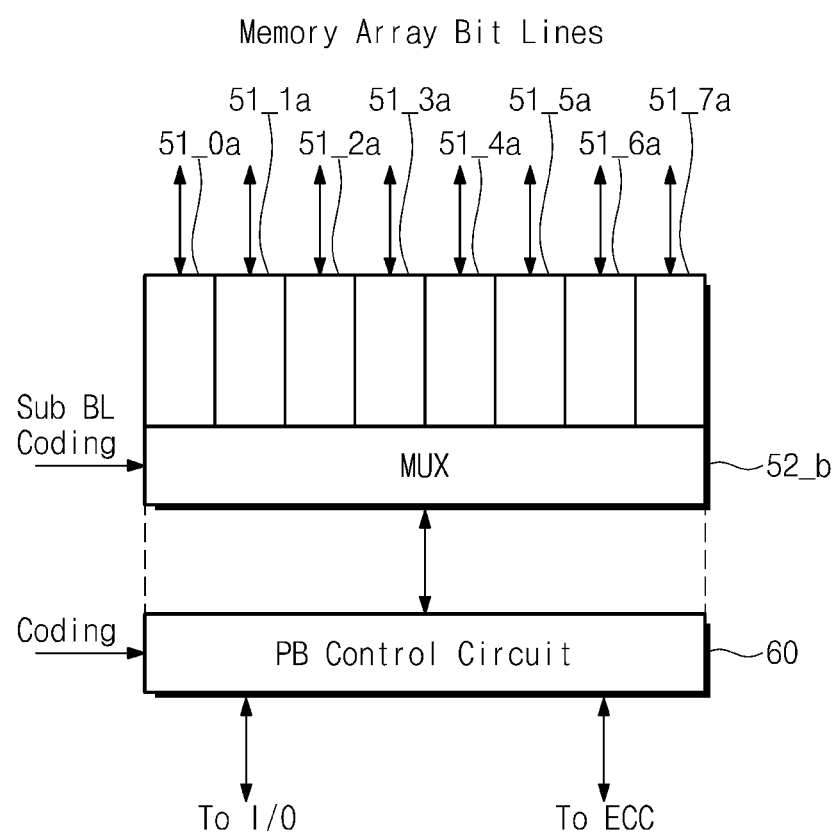
Figure 4:
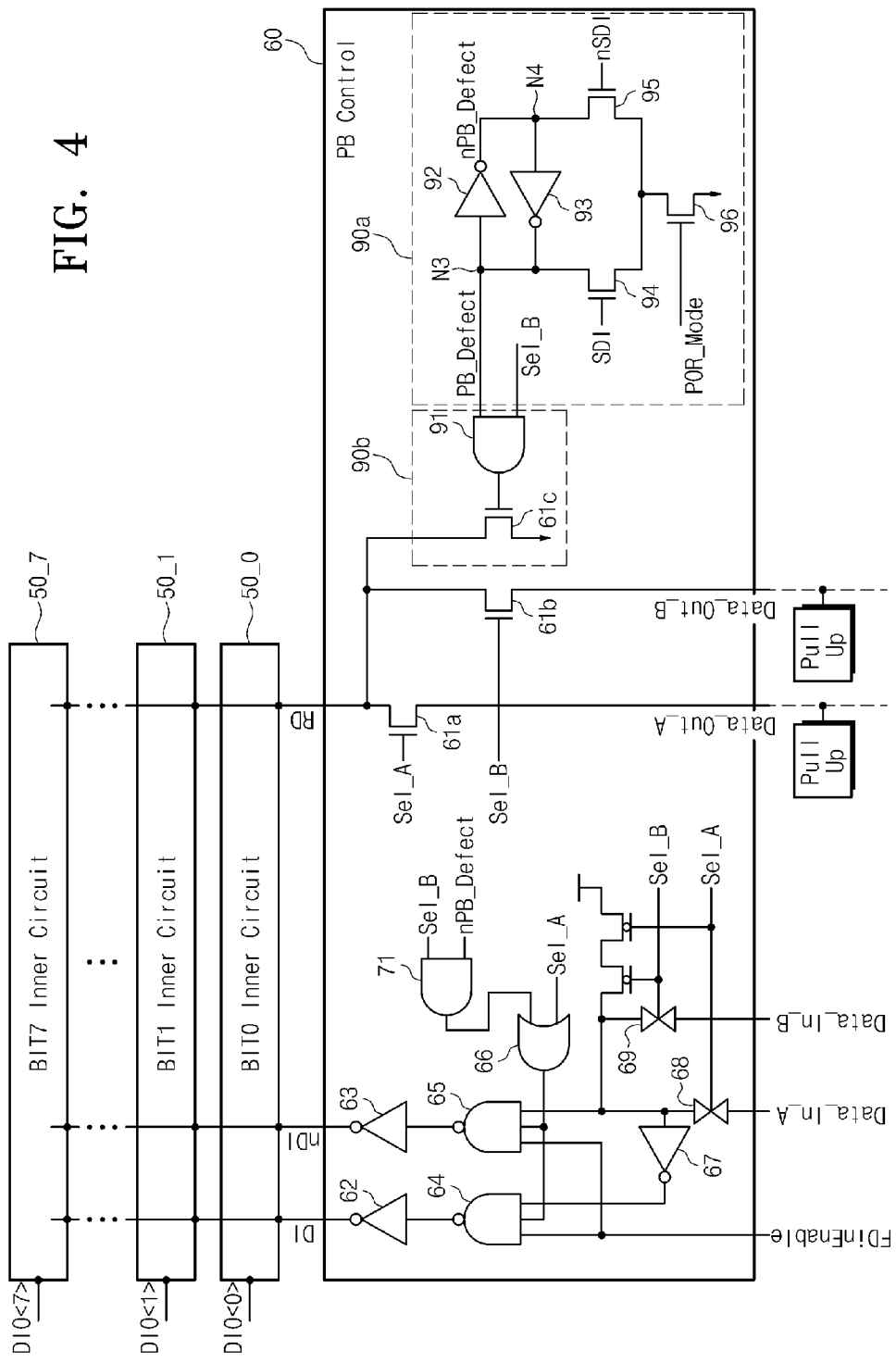
FIG. 4 is a diagram schematically illustrating an internal circuit configuration of a PB unit.
Figure 5:
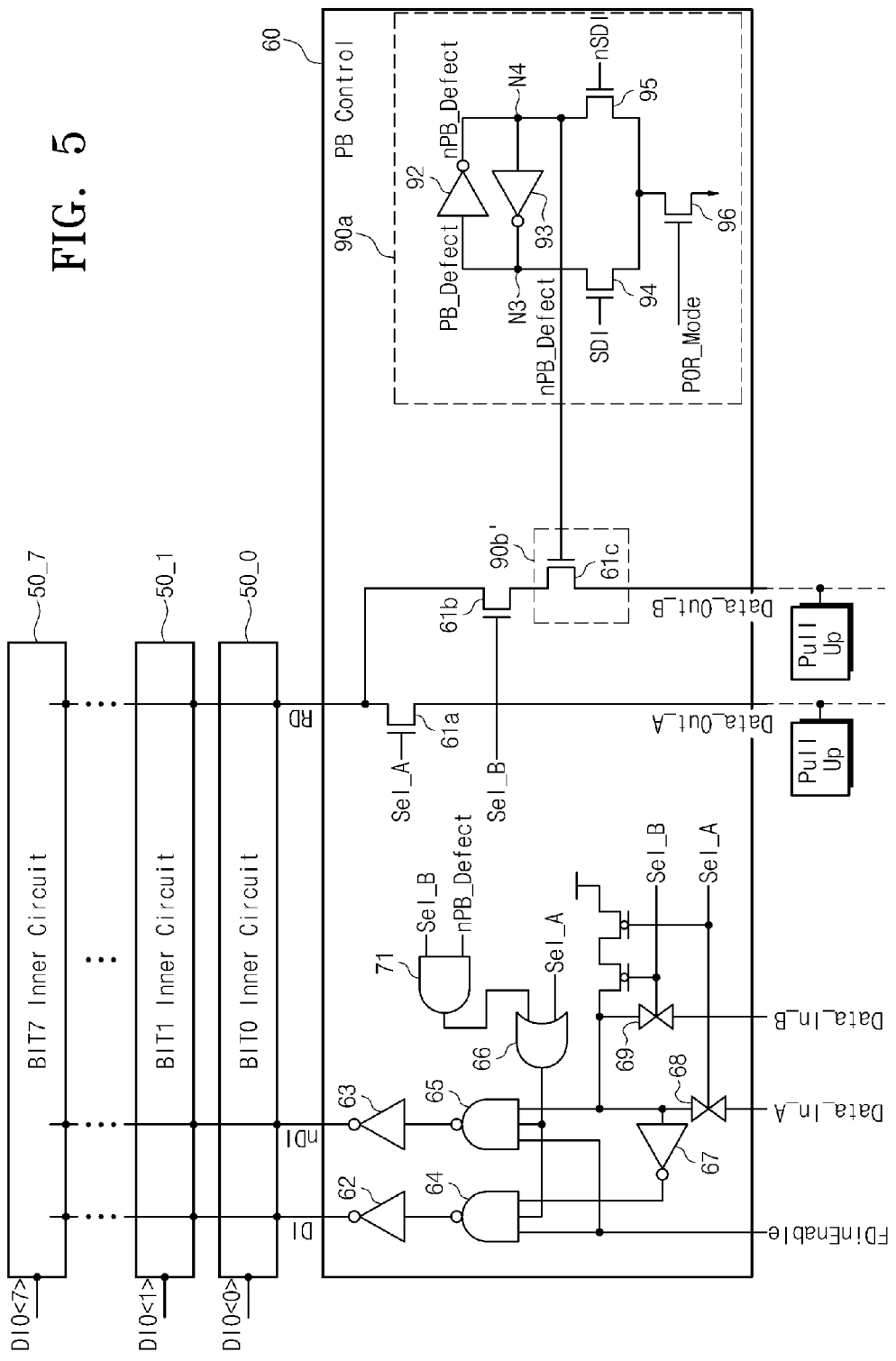
FIG. 5 is a diagram schematically illustrating another internal circuit configuration of a PB unit.

The page buffers 102a to 102d of the page buffer 102 all are configured the same, and a circuit configuration thereof will be described with reference to FIGS. 2 through 6. FIG. 2 is a diagram schematically describing a data read operation of a portion corresponding to a page buffer 102, a column coding circuit 103, and an ECC column coding circuit 108 illustrated in FIG. 1. FIGS. 3A-3B are diagrams schematically illustrating a PB 4IO unit and a PB unit illustrated in FIG. 2. FIG. 4 is a circuit diagram schematically illustrating a PB unit. FIG. 5 is a diagram schematically illustrating a configuration of internal other circuits of a PB unit.

Figure 6:
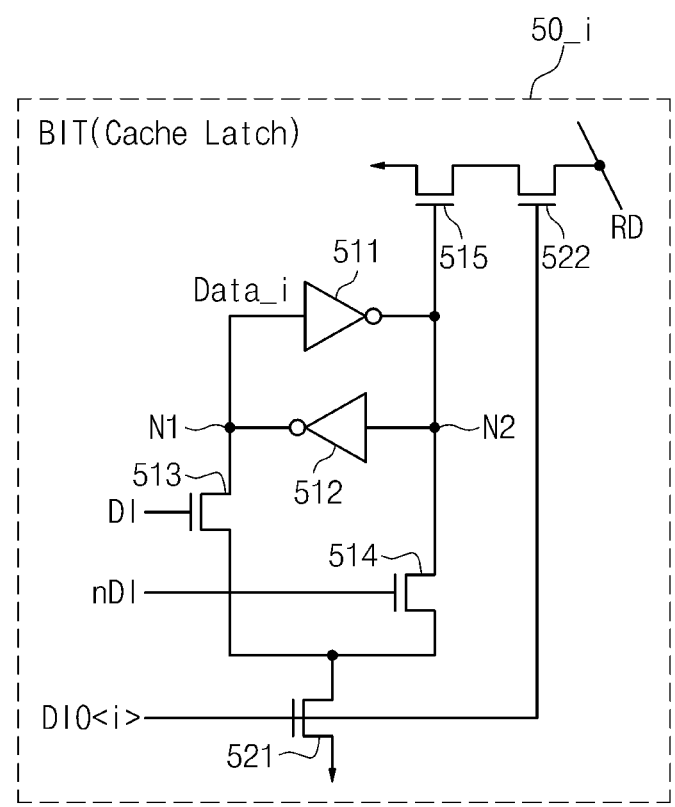
FIG. 6 is a diagram schematically illustrating a circuit configuration of a bit inner circuit $50\_i$ (i being 0 to 7) illustrated in FIG. 4 and FIG. 5.

FIG. 6 is a circuit diagram schematically illustrating a bit inner circuit 50_i (i being an integer of 0 to 7) illustrated in FIGS. 4 and 5.

Referring to FIG. 2, a portion corresponding to a page buffer 102, a column coding circuit 103, and an ECC column coding circuit 108 illustrated in FIG. 1 has a PB 4IO unit that latches four data from four IO lines and reads the latched data from a first data bus or a second data bus or writes data with respect to four IO lines.

In FIG. 2, there are illustrated ten PB 4IOs, that is, PB0 IO 0123 (PB 4IO unit) 30_0, PB0 IO 4567 (PB 4IO unit) 30_1, PB1 IO 0123 (PB 4IO unit) 30_2, PB1 IO 4567 (PB 4IO unit) 30_3, PB2 IO 0123 (PB 4IO unit) 30_4, PB2 IO 4567 (PB 4IO unit) 30_5, PB3 IO 0123 (PB 4IO unit) 30_6, PB3 IO 4567 (PB 4IO unit) 30_7, PB4 IO 0123 (PB 4IO unit) 30_8, and PB4 IO 4567 (PB 4IO unit) 30_9.

Here, an IO line is an input/output line that is installed between a multiplexer 52_b and a PB control circuit 60 as will be more fully described below. In exemplary embodiments, the IO line is electrically connected to any one of eight bit lines through a multiplexer 52_b and eight bit circuits 51_0a to 51_7a. That is, the IO line is a signal line through which memory cell transistor data or data read from a memory cell transistor is transferred.

Referring to FIG. 3A, the PB 4IO units illustrated in FIG. 2 has the same configuration. In FIG. 3A, there is illustrated the PB 4IO unit 30_0 illustrated in FIG. 2. The PB 4IO unit 30_0 consists of four PB units 30_00 to 30_03.

When a selection signal Sel_A<0> having an active level (high level) is provided from a column coding circuit 103, each of the PB units 30_00 to 30_03 connects an IO line and a data bus (second bus) (data bus Data_A<7:0> as will be described below). In this case, as illustrated in FIG. 3A, four data-out bit signals Data_Out_A<0> to Data_Out_A<3> are read from four IO lines onto a data bus Data_A<3:0>.

Also, when a selection signal Sel_B<0> having an active level (high level) is provided from an ECC column coding circuit 108, each of the PB units 30_00 to 30_03 connects an IO line and an ECC bus (first bus) (data bus Data_B<19:0> as will be described below). In this case, as illustrated in FIG. 3A, four data-out bit signals Data_Out_B<0> to Data_Out_B<3> are read from four IO lines onto a data bus Data_B<3:0>.

Referring to FIG. 3B, each of PB units illustrated in FIG. 3A comprises eight bit circuits 51_1a to 51_7a (configured the same as those in FIG. 18), a multiplexer 52_b (configured the same as that illustrated in FIG. 18), and a page buffer (PB) control circuit 60 of the inventive concept.

Below, a detailed circuit configuration of a PB unit will be more fully described with reference to FIGS. 4 and 6.

In FIG. 6, in each of the bit inner circuits 50_0 through 50_7, a data sensing unit and a latch unit to perform a write operation and a driver unit to drive a signal line at a read operation are illustrated as being implemented using transistors and inverter circuits. In addition, a combination of bit circuits 51_0a to 51_7a and a multiplexer 52_b illustrated in FIG. 3B corresponds to the bit inner circuits 50_0 to 50_7. That is, since a bit inner circuit is selected by a selection signal DIO, it partially has functions of a bit circuit and a multiplexer 52_b. Also, a bit inner circuit illustrated in FIG. 6 is configured the same as a bit inner circuit of a conventional PB unit illustrated in FIG. 18.

As illustrated in FIG. 6, a bit inner circuit 50_i (i being an integer of 0 to 7 and eight bit inner circuits having the same structure) is formed of an inverter circuit 511, an inverter circuit 512, a transistor 513, a transistor 514, a transistor 515, a transistor 521, and a transistor 522. Here, the transistors 513, 514, 515, 521, and 522 may be an N-channel MOS transistor.

A latch unit of the bit inner circuit 50_i is formed of the inverter circuits 511 and 512. Here, an input terminal of the inverter 511 and an output terminal of the inverter 512 are connected to a connection node N1, and an output terminal of the inverter 511 and an input terminal of the inverter 512 are connected to a connection node N2.

The connection node N1 is connected to a memory cell transistor (not illustrated) through a bit line. Data that a memory cell transistor stores appears on the connection node N1 as Data_i at a read operation. Data that is to be stored in a memory cell transistor appears on the connection node N1 as Data_i at a write operation. For example, when a memory cell transistor stores a low level (data 0), a voltage of Data_i has a low level. When a memory cell transistor stores a high level (data 1), a voltage of Data_i has a high level.

In the bit inner circuit 50_i, the driver unit includes a transistor 515 and a transistor 522.

The transistor 522 has a drain connected to receive a read signal RD, a gate connected to receive a selection signal DIO<i>, and a source connected to a drain of the transistor 515.

The transistor 515 has a drain connected to the source of the transistor 522, a gate connected to the connection node N2, and a source grounded.

Here, the selection signal DIO<i> (I=0 to 7) may be Sub BL Coding illustrated in FIG. 3B. The column coding circuit 103, for example, sets one of the selection signals DIO<i> to a high level based on a 3-bit address signal from an address control circuit (not illustrated), or the ECC column coding circuit 108 sets one of the selection signals DIO<i> to a high level based on a 3-bit address signal from an ECC circuit 107. Thus, one of bit inner circuits 50_0 to 50_7 illustrated in FIG. 4 may be selected.

With the above-described configuration, if the selection signal DIO<i> has a high level at a data read operation on a memory cell transistor, a logical level of the read signal RD is set to the same logical level as Data_i. That is, when Data_i is at a high level with the read signal RD pre-charged to a high level, for example, the transistor 515 is turned off, the transistor 522 is turned on and the read signal RD retains a high level. When Data_i is at a low level, the transistor 515 is turned on, the transistor 522 is turned on and the bit inner circuit 50_i changes the read signal RD from a high level to a low level.

A line of the read signal RD is connected to a PB control circuit 60 as illustrated in FIG. 4. At a first operation mode (ECC mode), a line of the read signal RD is connected to an ECC bus in response to a selection signal Sel_B (column address signal that the ECC column coding circuit 108 outputs). Thus, Data_i of the bit inner circuit 50_i is output on the ECC bus as a data-out signal Data_Out_B.

Meanwhile, at a second operation mode (normal mode), a line of the read signal RD is connected to a data bus in response to a selection signal Sel_A (column address signal that the column coding circuit 103 outputs). Thus, Data_i of the bit inner circuit 50_i is output on the data bus as a data-out signal Data_Out_A.

Returning to FIG. 6, the transistors 513, 514, and 521 constitute a sensing unit of the bit inner circuit 50_i.

The transistor 513 has a drain connected to the connection node N1, a gate connected to receive a write signal DI, and a source connected to a drain of the transistor 521.

The transistor 514 has a drain connected to the connection node N2, a gate connected to receive a write signal nDI, and a source connected to the drain of the transistor 521.

The transistor 521 has a drain connected to the source of the transistor 513 and the source of the transistor 513, a gate connected to receive a selection signal DIO<i>, and a source grounded.

The lines of the write signals DI and nDI are connected to the PB control circuit 60 as illustrated in FIG. 4. As will be described below, if they are connected to a data bus ECC Bus according to the selection signal Sel_B at the first operation mode, a data-in signal Data_In_B is received from ECC Bus. Thus, the PB control circuit 60 varies one of the write signals DI and nDI from a low level to a high level in response to a level of the data-in signal Data_In_B. At this time, the other of the write signals DI and nDI retains a low level.

Meanwhile, at the second operation mode, connection to Data Bus is made according to the selection signal Sel_A to receive a data-in signal Data_In_A from the Data Bus. Thus, the PB control circuit 60 varies one of the write signals DI and nDI from a low level to a high level in response to a level of the data-in signal Data_In_A. At this time, the other of the write signals DI and nDI retains a low level.

With the above-described structure, if a selection signal DIO<i> goes to a high level at a data write operation on a memory cell transistor, a Data_i level of the bit inner circuit 50_i is decided according to levels of the write signals DI and nDI. In detail, when one of a data-in signal Data_In_A and a data-in signal Data_In_B is at a low level (data 0), the PB control circuit 60 outputs a high level of write signal DI and a low level of write signal nDI. By this, in the bit inner circuit 50_i, the transistor 513 is turned on and the transistor 514 is turned off. At this time, the connection node N1 is set to a low level, and the connection node N2 is set to a high level. Thus, Data_i has the same logical low level (data 0) as a data bus.

Meanwhile, when the data-in signal Data_In_A or the data-in signal Data_In_B is at a high level (data 1), the PB control circuit 60 outputs a low level of write signal DI and a high level of write signal nDI. By this, in the bit inner circuit 50_i, the transistor 513 is turned off, and the transistor 514 is turned on. At this time, the connection node N1 is set to a high level and the connection node N2 is set to a low level. This means that Data_i has the same logical high level (data 1) as the data bus.

Returning to FIG. 4, the PB control circuit 60 comprises a write unit performing a data transfer from a data bus to a page buffer and a read unit performing a data transfer from a page buffer to a data bus.

The read unit of the PB control circuit 60 is formed of transistors 61a and 61b. The transistors 61a and 61b may be an NMOS transistor.

The transistor 61a has a drain connected to a line of the read signal RD, a gate connected to receive the selection signal Sel_A, and a source connected to a data bus (second data bus). The transistor 61b has a drain connected to receive the read signal RD, a gate connected to receive the selection signal Sel_B, and a source connected to ECC Bus (first data bus).

Here, the selection signal Sel_A may be a column address signal that a column coding circuit 103 generates in response to address bits, for example, an address Address A received from an address control circuit (not illustrated). The selection signal Sel_B may be a column address signal that an ECC column coding circuit 108 generates in response to a part of address bits, for example, an address Address B received from an ECC circuit 107 illustrated in FIG. 1.

Receiving the selection signal Sel_B having a high level from the ECC column coding circuit 108 at a data read operation of an ECC mode (first operation mode), the read unit of the PB control circuit 60 turns on the transistor 61b such that a line of the read signal RD is connected to ECC Bus. Thus, data of memory cell transistors (Data_i of a bit inner circuit) stored in the bit inner circuits 50_0 to 50_7 are output to the ECC Bus as a data-out signal Data_Out_B.

In case the selection signal Sel_A having a high level is received from the column coding circuit 103 at a data read operation of a normal mode (second operation mode), the read unit of the PB control circuit 60 turns on the transistor 61a such that a line of the read signal RD is connected to Data Bus. Thus, data of memory cell transistors stored in the bit inner circuits 50_0 to 50_7 are output to Data Bus as a data-out signal Data_Out_A.

The read unit of the PB control circuit 60 has the following structure such that when a memory cell transistor or a bit line connected to a memory cell transistor is abnormal, in the page buffers 102a and 102c, data provided to the ECC circuit 107 has fixed data (fixed to data 0) at a data read operation of an ECC mode.

That is, the read unit of the PB control circuit 60 comprises a defect information storing unit 90a and a data fixing unit 90b as illustrated in FIG. 4.

The defect information storing unit 90a comprises inverter circuits 92 and 93 and transistors 94, 95, and 96. Here, the transistors 94, 95, and 96 may be an N-channel MOS transistor.

A latch unit of the defect information storing unit 90a is formed of the inverter circuits 92 and 93. The inverter circuit 92 has an output terminal connected to a connection node N4 and an input terminal of the inverter 93 and an input terminal connected to a connection node N3 and an output terminal of the inverter circuit 93.

The connection node N3 is connected to a first input terminal of the AND circuit 91. The connection node N3 provides a defect signal PB_Defect indicating that data stored in the latch unit is defective. The connection node N4 provides a defect signal nPB_Defect indicating that data stored in the latch unit is defective.

A sensing unit of the defect information storing unit 90a comprises transistors 94, 95, and 96.

The transistor 94 has a drain connected to the connection node N3, a gate connected to a line of a defect information signal SDI, and a source connected to a drain of the transistor 96.

The transistor 95 has a drain connected to the connection node N4, a gate connected to a line of a defect information signal nSDI, and a source connected to the drain of the transistor 96.

The transistor 96 has a drain connected to the source of the transistor 94 and the source of the transistor 95, a gate connected to a line of a power-on reset signal POR_Mode, and a source grounded.

Here, the defect information signal SDI and the defect information signal nSDI are signals indicating whether a bit line connected to the PB control circuit 60 or a memory cell transistor connected to a corresponding bit line is defective. In the event that a test result executed after fabrication indicates that a bit line connected to the PB control circuit 60 is defective, the defect information signal SDI is set to data 0 (low level) and the defect information signal nSDI is set to data 1 (high level). Or, in the event that a test result executed after fabrication indicates that a bit line connected to the PB control circuit 60 is not defective, the defect information signal SDI is set to a high level and the defect information signal nSDI is set to a low level. Before shipment, such defect information signals are stored at a storage area for system, for example, of the NAND flash memory 10 because they are in connection with the selection signal Sel_B indicating a location of the PB control circuit 60.

Also, the power-on reset signal POR_Mode is a signal maintaining a high level during a predetermined time period (i.e., a time period where the defect information signals are transferred to the PB control circuit 60 from the storage area corresponding to the system) after the NAND flash memory 10 is powered up.

When the NAND flash memory 10 is powered up, the power-on reset signal POR_Mode goes to a high level. If a bit line connected to the PB control circuit 60 is defective, the defect information storing unit 90a turns off the transistor 94 and turns on the transistor 95. By this, the node N3 is set to a high level, and the node N4 is set to a low level. In this case, the defect signal PB_Defect has a high level. Since the power-on reset signal POR_Mode goes to a low level after a transfer period, the defect information storing unit 90a maintains the defect signal PB_Defect by a high level during a period where a power is supplied to the NAND flash memory 10.

When the NAND flash memory 10 is powered up, the power-on reset signal POR_Mode goes to a high level. If a bit line connected to the PB control circuit 60 is not defective, the defect information storing unit 90a turns on the transistor 94 and turns off the transistor 95. By this, the node N3 is set to a low level, and the node N4 is set to a high level. In this case, the defect signal PB_Defect has a low level. Since the power-on reset signal POR_Mode goes to a low level after a transfer period, the defect information storing unit 90a maintains the defect signal PB_Defect by a low level during a period where a power is supplied to the NAND flash memory 10.

The data fixing unit 90b is formed of the AND circuit 91 and a transistor 61c. Here, the transistor 61c is an NMOS transistor.

The AND circuit 91 is a 2-input 1-output logic circuit. The AND circuit 91 has a first input terminal connected to the connection node N3 and a second input terminal connected to a line of the selection signal Sel_A, and an output terminal connected to a gate of the transistor 61c.

The transistor 61c has a drain connected to a line of a read signal RD, a gate connected to the output terminal of the AND circuit 91, and a source grounded.

In the event that a bit line connected to the PB control circuit 60 is not defective, the defect signal PB_Defect has a low level. In this case, since the AND gate 91 outputs a low level of output signal, the transistor 61c of the data fixing unit 90b is turned off. That is, the data fixing unit 90b does not operate.

Meanwhile, in the event that a bit line connected to the PB control circuit 60 is defective, the defect signal PB_Defect has a high level. When ECC is used, that is, at an ECC mode, if a high level of selection signal Sel_B is provided to the AND circuit 91, the AND circuit 91 outputs a high level of output signal, the transistor 61c is turned on in response to the output of the AND circuit 91. In this case, ECC Bus_1 is grounded such that Data_Out_B is fixed to a low level (GND level). That is, in the event that a bit line connected to the PB control circuit 60 is defective, the PB control circuit 60 acts as a data fixing circuit that outputs read data Data_Out_B having a fixed level (low level) to ECC Bus_1 at the ECC mode.

In addition, at a data read operation of a normal mode, since the PB control circuit 60 is selected by the selection signal Sel_A, the AND circuit 91 outputs a low-level signal. In this case, the data fixing unit 90b being an additional circuit does not operate. If the defect signal PB_Defect is directly provided to a gate of the transistor 91c without using the AND circuit 91, the read signal RD is fixed to a low level when a bit line connected to the PB control circuit 60 is defective. That is, the PB control circuit 60 acts as a data fixing circuit that outputs a fixed level (low level) of read data Data_Out_A on Data Bus_1 when the selection signal Sel_A is received at a normal mode and outputs a low level of read data Data_Out_B when the selection signal Sel_B is received at an ECC mode.

The defect information storing unit 90a and the data fixing unit 90b illustrated in FIG. 4 may be implemented to have a configuration of FIG. 5. FIG. 5 is a diagram schematically illustrating another configuration of an inner circuit of a PB unit.

In FIG. 5, constituent elements that are the same as those in FIG. 4 are marked by the same reference numerals, and a description thereof is thus omitted.

The defect information storing unit 90a illustrated in FIG. 5 is configured the same as that illustrated in FIG. 4, but the data fixing unit 90b is replaced with a data fixing unit 90b'. A signal on a connection node N4 of the defect information storing unit 90a is used as a defect signal nPB_Defect.

The data fixing unit 90b' is formed of a transistor 61c. The transistor 61c has a source connected to ECC Bus (first data bus). The transistor 61b has a drain connected to a line of the read signal RD, a gate connected to a line of the selection signal Sel_B, and a source connected to a drain of the transistor 61c.

With the above configuration, in the event that a bit line connected to the PB control circuit 60 is defective, the defect signal nPB_Defect has a low level. In this case, since the transistor 61c is turned off, a transfer path between the read signal RD and ECC Bus_1 is blocked. For this reason, read data Data_Out_B is fixed to a high level through a pull-up circuit. Meanwhile, in the event that a bit line connected to the PB control circuit 60 is not defective, the defect signal nPB_Defect has a low level. In this case, the transistor 61c is always turned on. By this, the read signal RD, that is, data of a memory cell transistor is output onto ECC Bus_1 such that it is read as read data Data_Out_B.

As compared with a data fixing unit 90b, the data fixing unit 90b' has such a merit that an AND circuit is not required because the transistors 61b and 61c are respectively connected in series between a line of the read signal RD and ECC Bus_1.

In the data fixing unit 90b' illustrated in FIG. 5, if the transistor 61c is inserted between a line of the read signal RD and drains of the transistors 61a and 61b, that is, between a line of the read signal RD and the PB control circuit 60, the PB control circuit 60 acts as a data fixing circuit that outputs to Data Bus_1 a fixed level (high level) of read data Data_Out_A in response to the selection signal Sel_A provided at the normal mode and a high level of read data Data_Out_B in response to the selection signal Sel_B provided at the ECC mode.

As described above, in the event that a bit line connected to the PB control circuit 60 is defective, data Data_Out_A or Data_Out_B may be fixed to a low level or a high level.

The write unit of the PB control circuit 60, as illustrated in FIG. 4, comprises inverter circuits 62, 63, 67, NAND circuits 64 and 65, an OR circuit 66, switches 68 and 69, and an AND circuit 71.

The inverter circuit 62 is a logical inversion circuit and has an output terminal connected to a line of the write signal DI and an input terminal connected to an output terminal of the NAND circuit 64. The inverter circuit 63 is a logical inversion circuit and has an output terminal connected to a line of the write signal nDI and an input terminal connected to an output terminal of the NAND circuit 65.

The NAND circuit 64 is a 3-input 1-output NAND circuit and has a first input terminal connected to a line of a write enable signal fDinEnable, a second input terminal connected to an output terminal of the OR circuit 66, and a third input terminal connected to an output terminal of the inverter circuit 67. An output terminal of the NAND circuit 64 is connected to an input terminal of the inverter circuit 62.

The NAND circuit 65 is a 3-input 1-output NAND circuit and has a first input terminal connected to a line of the write enable signal fDinEnable, a second input terminal connected to the output terminal of the OR circuit 66, and a third input terminal connected to a first input/output terminal of the switch 68 and a first input/output terminal of the switch 69. An output terminal of the NAND circuit 65 is connected to an input terminal of the inverter circuit 63.

The OR circuit 66 is a 2-input 1-output logic circuit and has a first input terminal connected to an output terminal of the AND circuit 71 and a second input terminal connected to a line of the selection signal Sel_A. An output terminal of the OR circuit 66 is connected to the second input terminal of the NAND circuit 64 and the second input terminal of the NAND circuit 65. The AND circuit 71 logically combines the selection signal Sel_B and the defect signal nPB_Defect. In case the defect signal nPB_Defect has a high level (in case a defect is not generated), the selection signal Sel_B has a high level; therefore, the second input terminal of the NAND circuit 65 has a high level. This means that a write condition is satisfied. Meanwhile, if the defect signal nPB_Defect has a low level (defective page buffer), the second input terminal of the NAND circuit 65 is not set to a high level in an operation mode of the selection signal Sel_B. Thus, writing is not made.

The inverter circuit 67 is a logical inversion circuit and has an input terminal connected to the first input/output terminal of the switch 68 and the first input/output terminal of the switch 69 and an output terminal connected to the third input terminal of the NAND gate 64.

The switch 68 is a bidirectional switch and has the first input/output terminal connected to the input terminal of the inverter circuit 67 and the third input terminal of the NAND circuit 65 and a second input/output terminal connected to Data Bus.

The switch 69 is a bidirectional switch and has the first input/output terminal connected to the input terminal of the inverter circuit 67 and the third input terminal of the NAND circuit 65 and a second input/output terminal connected to ECC Bus. In addition, an input of the inverter circuit 67 is pulled up by a PMOS transistor such that an input of the inverter circuit 67 is not set to a "don't care" state when any one of the bidirectional switches is unselected.

With the above-described structure, when the write enable signal fDinEnable is at a high level and the selection signal Sel_B is at a high level at a data write operation of the ECC mode (first operation mode), the write unit of the PB control circuit 60 turns on the switch 69 such that one of the write signals DI and nDI transitions from a low level to a high level in response to a level of the data-in signal Data_In_B received from ECC Bus.

In detail, when the data-in signal Data_In_B is at a low level (data 0), the write signal DI transitions to a high level. By this, Data_i of one of the bit inner circuits 50_0 to 50_7 goes to a low level. Afterwards, data 0 is written at a memory cell transistor through a program operation.

Meanwhile, when the data-in signal Data_In_B is at a high level (data 1), the write signal nDI transitions to a high level. By this, Data_i of one of the bit inner circuits 50_0 to 50_7 goes to a high level. Afterwards, data 1 is written at a memory cell transistor through a program operation.

If the write enable signal fDinEnable and the selection signal Sel_A have a high level at a data write operation of a normal mode (second operation mode), the write unit of the PB control circuit 60 turns on the switch 68 such that one of the write signals DI and nDI transitions from a low level to a high level in response to a level of the data-in signal Data_In_A received from Data Bus. In detail, when the data-in signal Data_In_A is at a low level (data 0), the write signal DI transitions to a high level. By this, Data_i of one of the bit inner circuits 50_0 to 50_7 goes to a low level. Afterwards, data 0 is written at a memory cell transistor through a program operation.

Meanwhile, when the data-in signal Data_In_A is at a high level (data 1), the write signal nDI transitions to a high level. By this, Data_i of one of the bit inner circuits 50_0 to 50_7 goes to a high level. Afterwards, data 1 is written at a memory cell transistor through a program operation.

As described above, the PB control circuit 60 is a circuit that controls a data transfer between a data bus (first data bus and second data bus) and a memory cell transistor connected through a bit line to one, selected by the selection signal DIO<i>, from among the bit inner circuits 50_0 to 50_7 constituting a PB unit of a page buffer 102.

Also, the line of the read signal RD, the line of the write signal DI, and the line (IO line) of the write signal nDI are lines connecting the PB control circuit 60 and the bit inner circuits 50_0 to 50_7 constituting the PB unit and are input/output lines to perform a data transfer of the PB unit. In exemplary embodiments, the PB control circuit 60 transfers write data and read data between an input/output unit of the page buffer 102 and the first and second data buses (ECC Bus and Data Bus).

Returning to FIG. 3A, an operation of a PB 4IO unit 30_0 according to the above-described configuration of the PB control circuit 60 will be described.

When a high level of selection signal Sel_A<0> is received from the column coding circuit 103, the PB 4IO unit 30_0 connects input/output lines IO_0 to IO_3 of four page buffers to a 4-bit data bus Data_A<3:0>. By this, the PB 4IO unit 30_0 outputs the data-out signals Data_Out_A<0> to Data_Out_A<3> (hereinafter, referred to as data-out signals Data_Out_A<3:0>) to the data bus Data_A<3:0>.

When a high level of selection signal Sel_B<0> is received from the ECC column coding circuit 108, the PB 4IO unit 30_0 connects input/output lines IO_0 to IO_3 of four page buffers to a 4-bit ECC Bus Data_B<3:0> (here, referred to as data bus Data_B<3:0>). By this, the PB 4IO unit 30_0 outputs the data-out signals Data_Out_B<0> to Data_Out_B<3> (hereinafter, referred to as data-out signals Data_Out_B<3:0>) to the data bus Data_Out_B<0> on the data bus Data_B<3:0>.

Returning to FIG. 2, at a data read operation, a page buffer 102, a column coding circuit 103, and an ECC column coding circuit 108 (here, referred to as a data read module) operate as follows according to the above-described configuration of the PB 4IO unit 30_0.

Also, input/output lines (data read lines RD illustrated in FIGS. 4 and 5) of page buffers connected to PB 4IO units 30_1 to 30_9 illustrated in FIG. 2 are referred to as IO lines IO_4 to IO_7, IO lines IO_8 to IO_11, IO lines IO_12 to IO_15, IO lines IO_16 to IO_19, IO lines IO_20 to IO_23, IO lines IO_24 to IO_27, IO lines IO_28 to IO_31, IO lines IO_32 to IO_35, and IO lines IO_36 to IO_39, respectively.

Also, the Data Bus is an 8-bit-wide bus and is referred to as a data bus Data_A<7:0>. The ECC Bus has a 20-bit-wide bus and is referred to as a data bus Data_B<19:0>.

At the normal mode (second operation mode), the column coding circuit 103 sets one of column addresses of selection signals Sel_A<0> to Sel_A<4> to a high level and the rest thereof to a low level, to output the selection signals Sel_A<0> to Sel_A<4> thus set to the data read module.

For example, at the normal mode, 40-bit data of the IO lines IO_0 to IO_39 is sequentially output onto the data bus Data_A<7:0> by sequentially providing the selection signals Sel_A<0> to Sel_A<4> to the data read module.

When the selection signal Sel_A<0> goes to a high level, the transistor 61a of the PB control circuit 60 is turned on. At this time, the PB 4IO unit 30_0 and the PB 4IO unit 30_1 connect the IO lines IO_0 to IO_7 to the data bus Data_A<7:0>. By this, the PB 4IO unit 30_0 and the PB 4IO unit 30_1 output data-out signals Data_Out_A<7:0> (data on the IO lines IO_0 to IO_7) to the data bus Data_A<7:0>.

Then, the transistor 61a of the PB control circuit 60 is turned on when the selection Sel_A<1> goes to a high level. At this time, the PB 4IO unit 30_2 and the PB 4IO unit 30_3 connect the IO lines IO_8 to IO_15 to the data bus Data_A<7:0>. By this, the PB 4IO unit 30_2 and the PB 4IO unit 30_3 output data-out signals Data_Out_A<7:0> (data on the IO lines IO_8 to IO_15) to the data bus Data_A<7:0>.

When the selection Sel_A<2> goes to a high level, the transistor 61a of the PB control circuit 60 is turned on. At this time, the PB 4IO unit 30_4 and the PB 4IO unit 30_5 connect the IO lines IO_16 to IO_23 to the data bus Data_A<7:0>. By this, the PB 4IO unit 30_4 and the PB 4IO unit 30_5 output data-out signals Data_Out_A<7:0> (data on the IO lines IO_16 to IO_23) to the data bus Data_A<7:0>.

The transistor 61a of the PB control circuit 60 is turned on when the selection Sel_A<3> goes to a high level. At this time, the PB 4IO unit 30_6 and the PB 4IO unit 30_7 connect the IO lines IO_24 to IO_31 to the data bus Data_A<7:0>. By this, the PB 4IO unit 30_6 and the PB 4IO unit 30_7 output data-out signals Data_Out_A<7:0> (data on the IO lines IO_24 to IO_31) to the data bus Data_A<7:0>.

Finally, when the selection Sel_A<4> goes to a high level, the transistor 61a of the PB control circuit 60 is turned on. At this time, the PB 4IO unit 30_8 and the PB 4IO unit 30_9 connect the IO lines IO_32 to IO_39 to the data bus Data_A<7:0>. By this, the PB 4IO unit 30_8 and the PB 4IO unit 30_9 output data-out signals Data_Out_A<7:0> (data on the IO lines IO_32 to IO_39) to the data bus Data_A<7:0>.

As described above, if the selection signal Sel_A is provided to the data read module five times, the PB 4IO units 30_0 to 30_9 connect the IO lines IO_0 to IO_39 to the data bus Data_A<7:0> by the 8-10 unit. By this, 40-bit data stored in memory cell transistors are read on the data bus through bit lines and IO lines IO_0 to IO_39.

At the ECC mode (first operation mode), the ECC column coding circuit 108 sets one of column addresses of the selection signals Sel_B<0> and Sel_B<1> to a high level and the other to a low level and outputs them to the data read module.

For example, at the ECC mode, 40-bit data of the IO lines IO_0 to IO_39 is sequentially read onto a data bus Data_B<19:0> by sequentially providing the selection signals Sel_B<0> and Sel_B<1> to the data read module.

When the selection Sel_B<0> goes to a high level, the transistor 61b of the PB control circuit 60 is turned on. At this time, the PB 4IO units 30_0, 30_2, 30_4, 30_6, and 30_8 connect the data bus Data_B<19:0> to IO lines IO_0 to IO_3, IO_8 to IO_11, IO_16 to IO_19, IO_24 to IO_27, and IO_32 to IO_35. By this, the PB 4IO units 30_0, 30_2, 30_4, 30_6, and 30_8 output data-out signals Data_Out_B<19:0> (data on the IO lines IO_0 to IO_3, IO_8 to IO_11, IO_16 to IO_19, IO_24 to IO_27, and IO_32 to IO_35) to the data bus Data_B<19:0>.

When the selection Sel_B<1> goes to a high level, the transistor 61a of the PB control circuit 60 is turned on. At this time, the PB 4IO units 30_1, 30_3, 30_5, 30_7, and 30_9 connect the data bus Data_B<19:0> to IO lines IO_4 to IO_7, IO_12 to IO_15, IO_20 to IO_23, IO_28 to IO_31, and IO_36 to IO_39. By this, the PB 4IO units 30_1, 30_3, 30_5, 30_7, and 30_9 output data-out signals Data_Out_B<19:0> (data on the IO lines IO_4 to IO_7, IO_12 to IO_15, IO_20 to IO_23, IO_28 to IO_31, and IO_36 to IO_39) to the data bus Data_B<19:0>.

As described above, if the selection signal Sel_B is provided to the data read module two times, the PB 4IO units 30_0 to 30_9 connect the IO lines IO_0 to IO_39 to the data bus Data_B<19:0> by the 20-10 unit. By this, 40-bit data stored in memory cell transistors are read on the ECC Bus through bit lines and IO lines IO_0 to IO_39.

For example, when a selection signal is not provided five times at the normal mode, data on IO lines IO_0 to 103, IO_8 to IO_11, IO_16 to IO_19, IO_24 to IO_27, and IO_32 to IO_35 is not read on the data bus. If a selection signal (Sel_B<0>) is provided once at the ECC mode, data of the IO lines IO_0 to IO_3, IO_8 to IO_11, IO_16 to IO_19, IO_24 to IO_27, and IO_32 to IO_35 may be read out on the ECC Bus.

Figure 7:
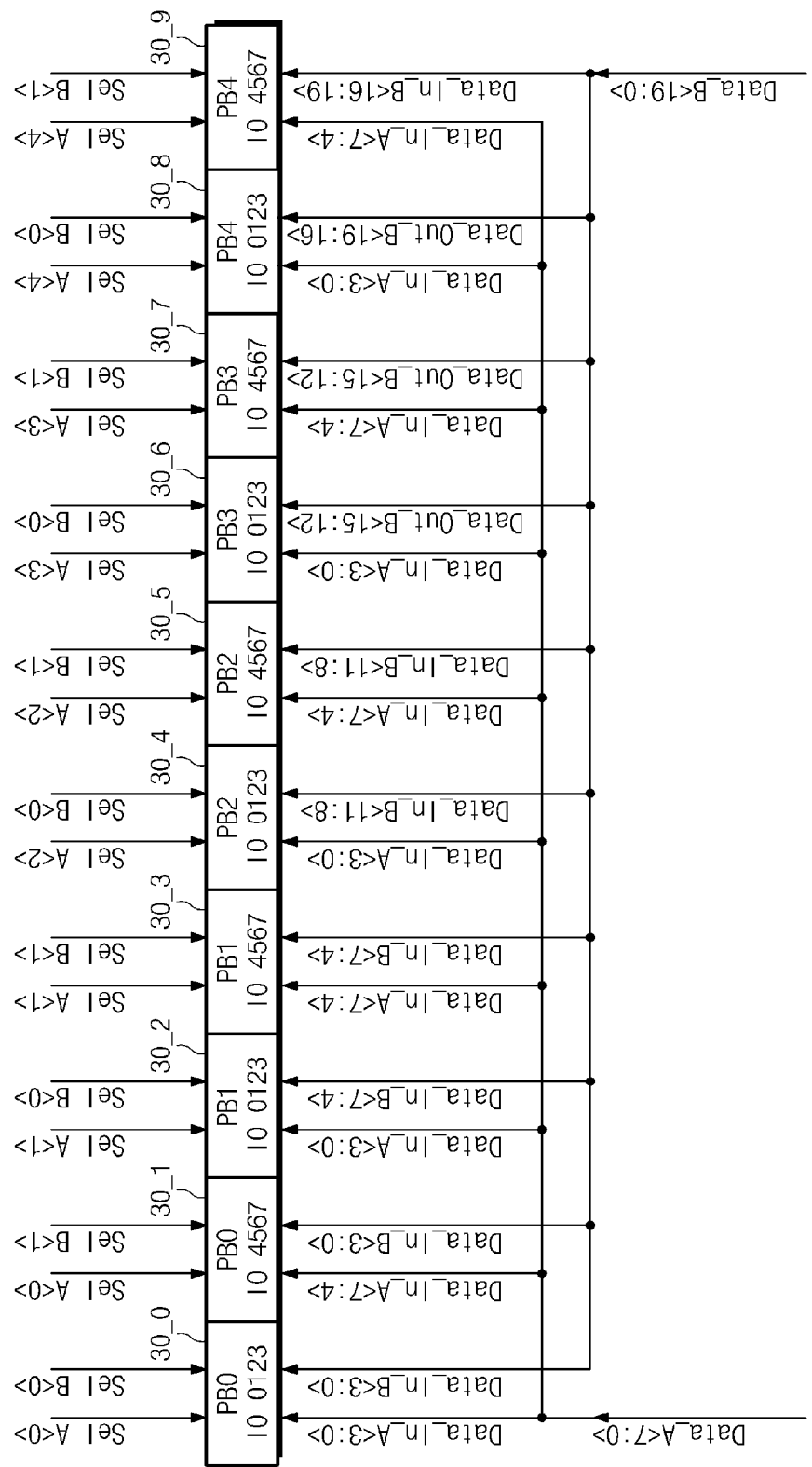
FIG. 7 is a diagram describing a data write operation of a portion corresponding to a page buffer, a column coding circuit, and an ECC column coding circuit illustrated in FIG. 1.

FIG. 7 is a diagram illustrating a data write operation of a portion corresponding to a page buffer 102, a column coding circuit 103, and an ECC column coding circuit 108 illustrated in FIG. 1.

A data write operation of a page buffer 102, a column coding circuit 103, and an ECC column coding circuit 108 (referred to as a data write module) is performed by an operation of a PB 4IO unit 30_0.

In the data write module, a data transfer is performed in a direction opposite to a direction described with reference to FIG. 2, and a description thereof is thus omitted.

In the data write module, for example, at a normal mode, data to be applied to IO lines IO_0 to 103, IO_8 to IO_11, IO_16 to IO_19, IO_24 to IO_27, and IO_32 to IO_35 is not written on Data Bus if a selection signal is not provided five times. In contrast, if a selection signal (Sel_B<0>) is provided once at the ECC mode, data to be applied to the IO lines IO_0 to IO_3, IO_8 to IO_11, IO_16 to IO_19, IO_24 to IO_27, and IO_32 to IO_35 is written on the ECC bus.

A NAND flash device (semiconductor memory device) 10 of the inventive concepts comprises a first data bus Data_B<19:0>, a second data bus Data_A<7:0> being different in number from the first data bus and independent from the first data bus Data_B<19:0>, and a data transfer unit (PB control circuit 60 of each of PB 4IO units 30_0 to 30_9). When a data transfer with memory cells is performed at the first operation mode, the data transfer unit connects bit lines, being equal in number to the first data bus, from among a plurality of bit lines to the first data bus to transfer data. When a data transfer with memory cells is performed at the second operation mode, the data transfer unit connects bit lines, being equal in number to the second data bus, from among a plurality of bit lines to the second data bus to transfer data.

If the number of bit lines is n (n being a common multiple of p and q being a natural number, p>q), the first data bus is q and the second data bus is q. If (n/p) address signals are received at the first operation mode, the data transfer unit connects p bit lines to "p" lines of the first data bus. If (n/q) address signals are received at the second operation mode, the data transfer unit connects q bit lines to the second data bus.

Also, the NAND flash memory 10 comprises a memory array 101, a page buffer 82 configured to read data from the memory array 101 by the page and store read data read from the memory array 101, an ECC circuit 107 configured to correct an error on the read data transferred from the page buffer 82 and write the error-corrected data back in the page buffer 82, and an IO pad (interface unit) 106 configured to output the read data written back in the page buffer 82. ECC Bus is connected to the ECC circuit 107, and Data Bus is connected to the IO_pad 106.

In the NAND flash memory 10, the page buffer 82 stores write data received through the IO_pad 106, and the ECC circuit 107 generates parity data on the write data transferred from the page buffer 82. The parity data and write data are written back in the page buffer.

By this, it is possible to control column coding, that is, addresses independently from the page buffer 102 by preparing a plurality of data buses (ECC Bus and Data Bus in an embodiment of the inventive concept).

In exemplary embodiments, it is possible to control addresses independently by forming a data bus to be independent from input/output lines of the page buffer 102 (IO_0 to IO_39), that is, a portion directly connected to the page buffer.

Thus, the semiconductor memory device according to an embodiment of the inventive concepts obtains the following effects.

(1) A High-Speed Operation is Implemented by Widening a Bus Width at the First Operation Mode (ECC Mode in the Inventive Concept).

There is described an example where when a column address is received once, 8-bit data is transferred to Data Bus at the second operation mode (normal mode) and 20-bit data is transferred at the ECC mode. A bus width is easily widened according to an input of Address_B (input of Sel_B to PB control circuit 60), that is, column coding to the page buffer 102. For example, if two column addresses are used for 1024 PB units, it is possible to transfer data with the ECC Bus being widened a 512-bit-wide bus at the ECC mode.

Also, it is possible to form a data bus independent from a portion directly connected to the page buffer and to control addresses independently. For this reason, as compared with the case that data is transferred to an ECC circuit using a part of the data bus, a high-speed data transfer is implemented.

In particular, since the PB control circuit 60 transfers fixed data to the ECC circuit 107 via ECC Bus with respect to a defective PB unit, it is unnecessary to transfer ECC-processed data to the column repair circuit 104 and the ECC circuit 107 via ECC Bus. Also, it is unnecessary to dispose the column repair circuit 104 on a path of ECC Bus with a widened bus width. A time taken to transfer data from a page buffer to an ECC circuit at ECC processing is shortened as long as a time taken for the column repair circuit 104 to perform a repair operation. Also, it is unnecessary to widen a bus width of Data Bus (second data bus) at ECC processing; therefore, an increase in the size of the column repair circuit 104 is prevented.

(2) Address Control and Freedom on Address Mapping are Improved.

At a normal mode, when 8-bit data is transferred using a column address, for example, data of IO lines IO_0 to IO_7 is transferred to Data Bus by providing a selection signal Sel_A<0> to PB 4IO units 30_0 and 30_1. In this behalf, at an ECC mode, data on all addresses is transferred to the ECC circuit in a lump by allocating an address independent from the selection signals Sel_B<0> and Sel_B<1> to the PB 4IO units 30_0 and 30_1. For example, although different addresses are assigned to the selection signal Sel_A at a normal mode, the same address as the selection signal Sel_B is assigned to normal data and parity data at the ECC mode; therefore, normal data and parity data are transferred to the ECC circuit in a lump. This means that address control at the second operation mode and address control at the first operation mode are independent from each other and freedom of address mapping is high.

Also, at the normal mode, a column address is used to generate five selection signals Sel_A<0> to Sel_A<4>. At the ECC mode, a column address is used to generate two selection signals Sel_B<0> and Sel_B<1>. This means that although a column address has a value not being $2^n$ in case of the user specification of the normal mode, it is easy to change an address space of the ECC mode to a unit space having a value of $2^n$.

Thus, a code configuration of the ECC circuit 107, for example, a code length may be decided with freedom on optimization on code length composition in case of cumulative coding and how long a code length is, so that performance is optimized.

(3) A Design Change is Easily Made.

In case of designing a product including an ECC circuit, it is assumed that a product is a derivation product and a product not including an ECC circuit is separately designed. In this case, data buses and column coding circuits associated with address control are independent at the ECC mode and the normal mode. By this, it is possible to separate a circuit associated with the ECC mode and a circuit associated with the normal mode. Thus, it is easy to eliminate the circuit associated with the ECC mode. This means that a design change is easily made.

Figure 8C:
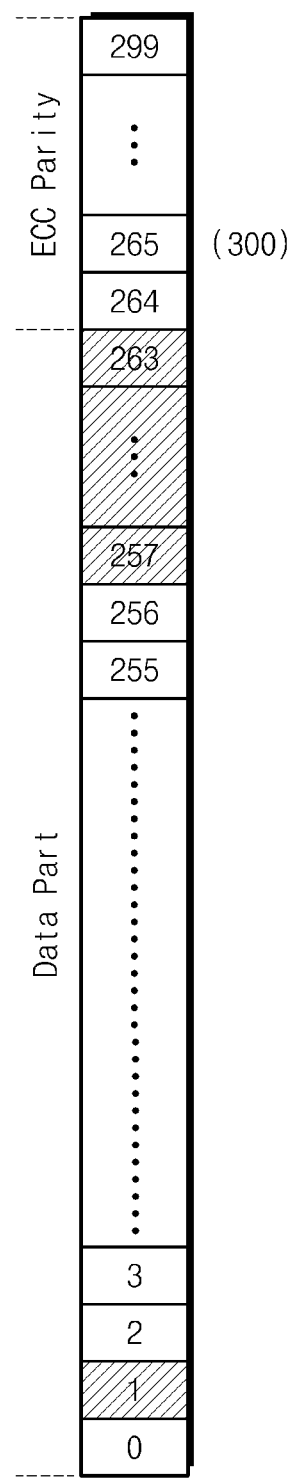

Now will be described operations of a first operation mode and a second operation mode of a NAND flash memory illustrated in FIG. 1 with reference to a configuration of a page buffer 102 and an operation flow chart. FIGS. 8A-8C are diagrams illustrating each page buffer of a page buffer 102. FIGS. 9A-9D are flow charts illustrating an operation of a page buffer 102.

In FIG. 8A, there are schematically illustrated a page buffer 120a for main data (normal data), a page buffer 102b for column repair for main data (repair data of normal data), a page buffer 102c for ECC parity (parity data), and a page buffer 102d for parity's column repair (repair data of parity data).

In FIG. 8A, numbers indicate PB units (unit formed of PB control circuit 60 and bit inner circuits 50_0 through 50_7 illustrated in FIGS. 4 and 5) constituting the page buffers 102a through 102d. The numbers are numbers of selection signals Sel_A indicating locations of PB units, that is, Coding illustrated in FIG. 3B.

That is, the page buffer 102a includes 256 PB units 0 through 255 corresponding to normal data, the page buffer 102b includes 8 PB units 256 through 263 to perform repair of normal data, the page buffer 102c includes 36 PB units 264 through 299 corresponding to parity data, and the page buffer 102d includes 8 PB units 300 to 307 to perform repair of parity data.

In FIG. 8B, there is illustrated an example in which when eight bit lines connected to a PB unit 1 of the page buffer 102a or memory cell transistors connected to eight bit lines are defective, the PB unit 1 of the page buffer 102a is replaced with a PB unit 256 of the page buffer 102b. Also, in FIG. 8B, there is illustrated an example in which when eight bit lines connected to a PB unit 265 of the page buffer 102c or memory cell transistors connected to eight bit lines are defective, the PB unit 265 of the page buffer 102c is replaced with a PB unit 300 of the page buffer 102d.

In addition, PB units 257 to 263 of the page buffer 102b corresponding to a slashed portion in FIG. 8B are unused PB units, so that the PB units 257 to 263 are not selected by a column coding circuit 103 under a control of a column repair circuit 104. That is, the PB units 257 to 263 may be at an inactive state.

Also, PB units 301 to 307 of the page buffer 102d corresponding to a slashed portion in FIG. 8B are unused PB units, so that the PB units 301 to 307 are not selected by an ECC column coding circuit 108 under a control of a parity column repair circuit 105. That is, the PB units 301 to 307 may be at an inactive state.

At a normal mode, since the PB unit 1 of the page buffer 102a is not selected and the PB unit 256 replaced is selected by a selection signal Sel_A, a data-out signal Data_Out_A (data read from the PB unit 1) is output to an I/O pad 106 through Data Bus_1, Data Bus_2, and Data Bus_3 (second data bus). If write data is received from the I/O pad 106 at the normal mode, it is provided to the PB unit 256 through Data Bus_3, Data Bus_2, and Data Bus_1 as a data-in signal Data_A_In (data to be stored in the PB unit 1). As described above, a region of a page buffer where a user may provide a column address is from the PB unit 0 to the PB unit 255. That is, the PB unit 256 to 263 of the page buffer 102b, the PB units 264 to 299 of the page buffer 102c, and the PB units 300 to 307 of the page buffer 102d form a page buffer region that is inaccessible by a user.

Also, the PB unit 1 of the page buffer 102a is selected by a selection signal Sel_B at an ECC mode, and a data-out signal Data_Out_B fixed to a low level or a high level is transferred to an ECC circuit 107 through ECC Bus_1 and ECC Bus_2 (first data bus) so as to be used to perform ECC processing.

Also, the repaired PB unit 256 is selected by the selection signal Sel_B, and a data-out signal Data_Out_B is transferred to the ECC circuit 107 through ECC Bus_1, ECC Bus_2, and ECC Bus_3 so as to be used to perform ECC processing as read data of the PB unit 1 seen from the user.

At the ECC mode, if the ECC processing is ended, data to be written back at the PB unit 1 is provided to the PB unit 256 through ECC Bus_3, ECC Bus_2, and ECC Bus_1 (first data bus) as a data-in signal Data_A_In. In addition, data, corresponding to PB units 0 to 255, from among ECC-processed data may be provided to the external device as clear data through a data bus Data_A.

When the PB unit 265 of the page buffer 102c is selected by the selection signal Sel_B at the ECC mode, a data-out signal Data_Out_B fixed to a low level or a high level is transferred to a parity column repair circuit 105 through ECC Bus_1 and ECC Bus_2 (data bus Data_B).

Also, as the repaired PB unit 300 is selected by the selection signal Sel_B, a data-out signal Data_Out_B is transferred to the parity column repair circuit 105 through ECC Bus_1 and ECC Bus_2 to perform repair processing. Thus, data from the PB unit 300 is transferred to the ECC circuit 107 via ECC Bus_3 as a data-out signal of the PB unit 265 so as to be used to perform ECC processing.

At the ECC mode, if the ECC processing is ended, data to be written back at the PB unit 265 is provided to the parity column repair circuit 105 through ECC Bus_3 to perform repair processing, and resultant data is then provided to the PB unit 300 through ECC Bus_2 and ECC Bus_1 (first data bus) as a data-in signal Data_A_In. In addition, ECC-processed data is not output to the external device through the data bus Data_A as described above.

Figure 9A:
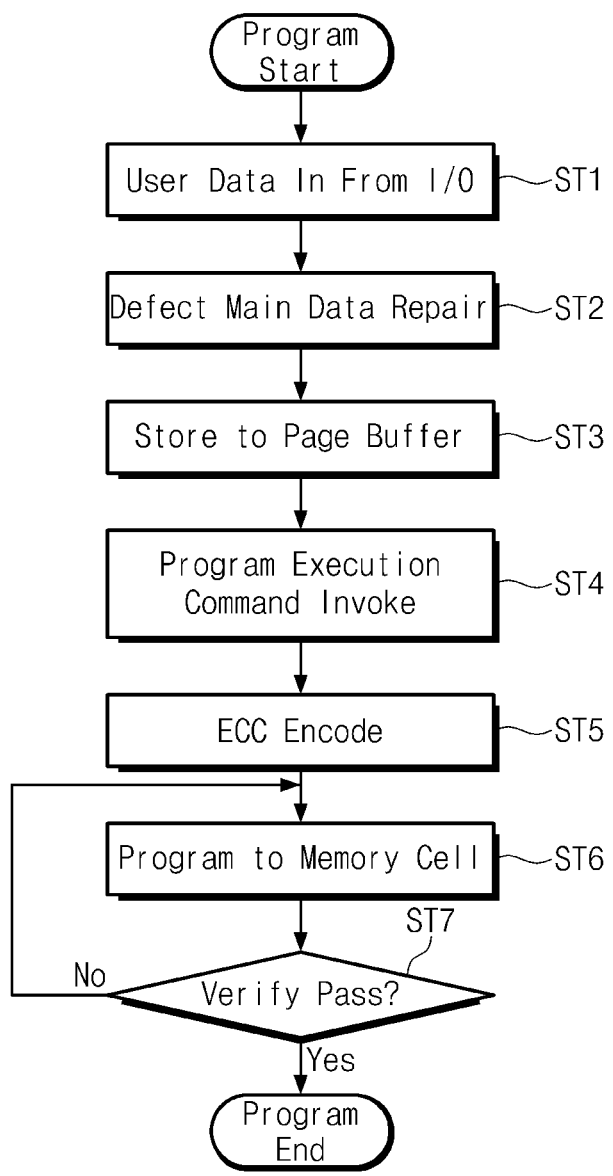
FIGS. 9A-9D are flow charts describing an operation of a page buffer.
Figure 9B:
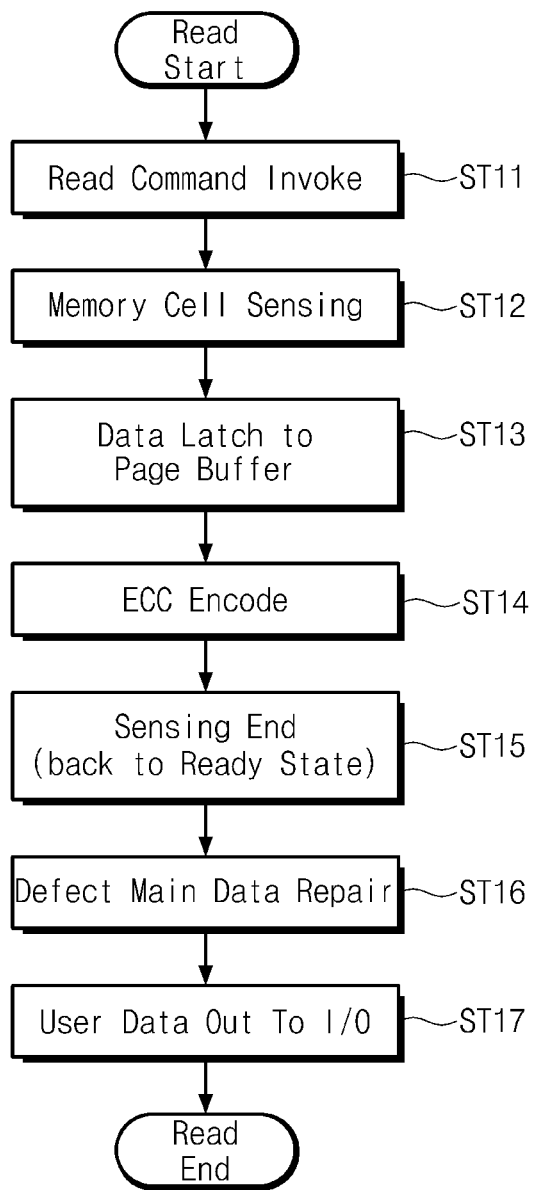
Figure 9C:
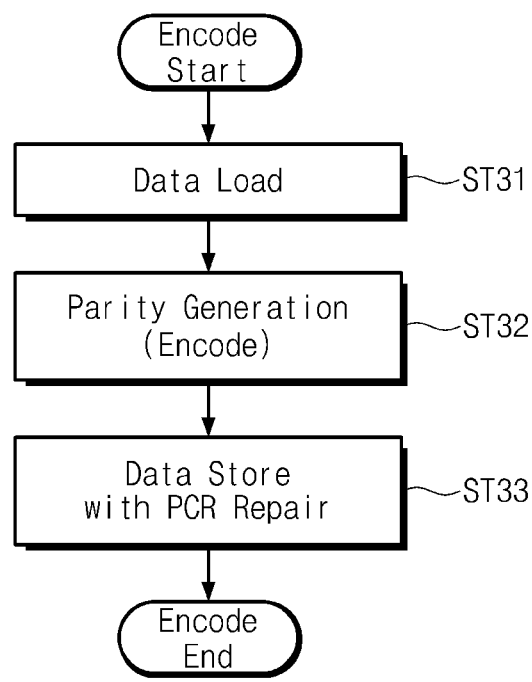
Figure 9D:
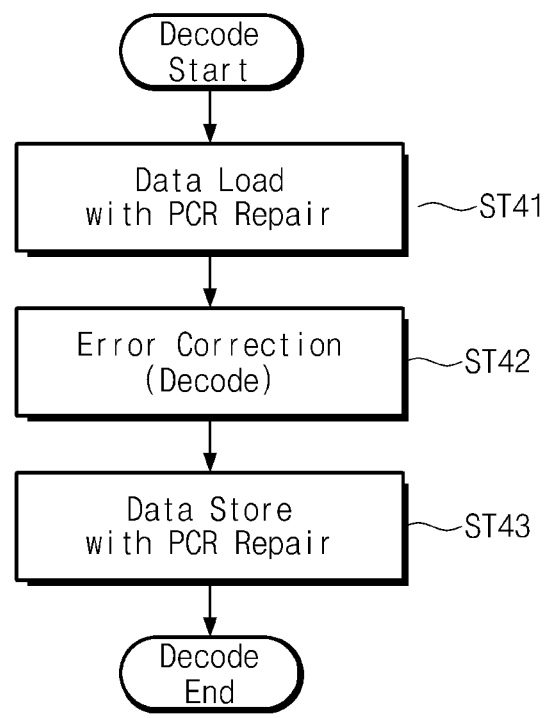

A data write operation to a memory cell transistor and a data read operation from a memory cell transistor are described with reference to FIGS. 9A-9D. FIG. 9A illustrated a data write operation, FIG. 9B illustrated a data read operation, FIG. 9C illustrates an ECC encoding operation, and FIG. 9D illustrated an ECC decoding operation.

[Data Write Operation]

In step ST1, a user provides a NAND flash memory 10 with a predetermined command (write command), an address (here, column address selecting a PB unit 1), and write data through an I/O pad 106.

In step ST2, a repair of normal data is executed. In detail, a column coding circuit 103 selects a PB unit 256 instead of a PB unit 1 under a control of a column repair circuit 104 such that the write data is stored in the PB unit 256.

After a time elapses, the method proceeds step ST6 when a mode is a normal mode (second operation mode) where the user invokes a program execution command (ST5). In step ST6, programming is executed such that data is transferred to a memory cell transistor from a page buffer through a bit line. In case of an ECC mode (first operation mode), the method proceeds to step ST5 to execute an ECC encoding operation as follows.

Here, FIG. 8C illustrates a code structure at ECC processing. As ECC, a data unit is data stored in PB units 0 to 263, and a parity unit (ECC parity) is data stored in PB units 264 to 299. Data to be written in the PB unit 1 is stored in the PB unit 256, and data stored in memory cell transistors are read and stored in PB units 0 and 2 to 255 through bit lines connected thereto.

In step ST31, data stored in the PB units 0 to 263 is provided to an ECC circuit 107 through ECC Bus_1, ECC Bus_2, and ECC Bus_3 (first data bus) (Data Load).

As described above, at this time, fixed data (L data in case of a PB control circuit 60 illustrated in FIG. 4 or H data in case of a PB control circuit 60 illustrated in FIG. 5) is provided from the PB unit 1 to the ECC circuit 107. Data that is data to be written in the PB unit 1 but data written in the PB unit 256 is provided to the ECC circuit 107 from the PB unit 256.

The ECC circuit 107 generates parity data through an encoding operation (ST32).

The ECC circuit 107 stores ECC-processed data in the PB units 0 to 299 (ST33).

At this time, an ECC coding circuit 108 selects a PB unit 300 instead of a PB unit 265 under a control of a parity column repair circuit 105. By this, parity data to be written back in the PB unit 265 is again stored in the PB unit 300.

At encoding, data is not written back to the PB units 0 to 263. However, the same data may be written back. Parity data is written at PB units 264 to 307. A write operation on a page buffer having an inactive state as a slashed portion in FIG. 8B is prevented by a circuit illustrated in FIG. 4 or 5.

Since data Data_i to be written at a memory cell is latched by a latch unit of each PB unit (refer to FIG. 6), a memory cell transistor is programmed (ST6).

Data is iteratively provided to a memory cell from a latch unit of each PB unit until a program operation is passed (ST7). If the program operation is passed, the iterative process is ended (ST7—Yes). If the program operation is not passed, the procedure goes to step ST6 to perform a program operation until the program operation is passed (ST7—No).

[Data Read Operation]

A user provides a predetermined command (read command) and an address (column address selecting the PB unit 1) (ST11).

Data of a memory cell transistor is sensed by a latch unit of each PB unit, and the sensed data is latched on a connection node N1 of a bit inner circuit illustrated in FIG. 6 (ST12). Data_i is latched by the latch unit of the bit inner circuit (ST13).

In case of a normal mode (second operation mode), the procedure goes to step ST15 to end a sensing operation. In case of an ECC mode (first operation mode), the procedure goes to step ST14 to perform an ECC decoding operation as follows.

In step S41, data stored in PB units 0 to 299 is provided to the ECC circuit 107 through ECC Bus_1, ECC Bus_2, and ECC Bus_3 (first data bus) (Data Load).

At this time, fixed data (L data in case of a PB control circuit 60 illustrated in FIG. 4 or H data in case of a PB control circuit 60 illustrated in FIG. 5) is provided from the PB unit 1 to the ECC circuit 107 as described above. Also, data that is data to be written in the PB unit 1 but data actually written in the PB unit 256 is provided to the ECC circuit 107 from the PB unit 256. Also, parity data that is data to be written in the PB unit 265 but actually data written in the PB unit 300 is provided to the parity column repair circuit 105 from the PB unit 300 through ECC Bus_1 and ECC Bus_2. After a repair operation, resultant data is provided to the ECC circuit 107 through ECC Bus_3.

The ECC circuit 107 performs a decoding operation to correct an error of data stored in the PB units 0 to 263 based on parity data (ST42).

The ECC circuit 107 stores ECC-processed data in the PB units 0 to 299 (ST43).

ECC-processed data (error-corrected data) is stored in the PB units 0 to 263. Since parity data units of PB units 264 to 307 are not used by the user, ECC-processed data (error-corrected data) is not stored in the PB units 264 to 307. However, it is possible to store ECC-processed data (error-corrected data) in the PB units 264 to 307. The PB unit 300 is selected instead of the PB unit 265 under a control of the parity column repair circuit 105. By this, error-corrected parity data to be written back in the PB unit 265 is stored in the PB unit 300.

A write operation on a page buffer having an inactive state as a slashed portion in FIG. 8B is inhibited by a circuit illustrated in FIG. 4 or 5.

Since data Data_i to be written at a memory cell is latched by a latch unit of each PB unit illustrated in FIG. 6, a sensing operation is ended, and a memory enters a readable state (ST15).

As a selection signal Sel_A is provided to the PB units 0 to 255, data stored therein is read through Data Bus_1, Data Bus_2, and Data Bus_3. At this time, a column coding circuit 103 selects the PB unit 256 instead of the PB unit 1 under a control of the column repair circuit 104.

The PB unit 256 outputs data that is data to be written at the PB unit 1 but data actually written at the PB unit 256. That is, a defect column is repaired (ST16).

As described above, data written at memory cell transistors through the PB unit 1 according to a user's request is written at other memory cells after repairing. Also, an error of the written data is corrected, and the error-corrected data is output from the I/O pad 106 (ST17).

A NAND flash memory 10 (semiconductor memory device) comprises ECC Bus_1 to ECC Bus_3 (first data bus), Data Bus_1 to Data Bus_3 (second data bus) being different in number from the first data bus and independent from the first data bus, and a page buffer 102 (data transfer unit). When a data transfer with memory cells is performed at an ECC mode (first operation mode), the page buffer 102 connects bit lines, being equal in number to the first data bus, from among a plurality of bit lines to the first data bus to transfer data. When a data transfer with memory cells is performed at a normal mode (second operation mode), the page buffer 102 connects bit lines, being equal in number to the second data bus, from among a plurality of bit lines to the second data bus to transfer data. Also, the data transfer unit comprises a page buffer 102*a* that amplifies a voltage of a bit line connected to a normal memory cell and latches the amplified result, a page buffer 102*b* that is replaced together with a normal memory cell and a bit line when the normal memory cell or the bit line connected to the first page buffer is defective, and a page buffer 102*c* that amplifies a voltage of a bit line connected to a parity memory cell and latches the amplified result. Also, the second data bus is connected to the first and second page buffers 102*a* and 102*b*, and the first data bus is connected to the first to third page buffers 102*a* to 102*c*.

Also, the semiconductor memory device comprises a page buffer 102*d* that is connected to the first data bus and is replaced together with a parity memory cell and a bit line when the parity memory cell or the bit line connected to the page buffer 102 is defective, a column repair circuit 104 (first repair circuit) that is connected to the second bus and replaces a page buffer, connected to a defective memory cell or bit line, from among the page buffer 102*a* with the page buffer 102*b*, a parity column repair circuit 105 (second repair circuit) that is connected to the first data bus and replaces a page buffer, connected to a defective memory cell or bit line, from among the page buffer 102*c* with the page buffer 102*d*, and an ECC circuit 107 that is connected to the first data bus and corrects an error of output data of the page buffers 102*a* and 102*b* based on output data of the page buffers 102*c* and 102*d*.

Also, the semiconductor memory device comprises a PB control circuit 60 (page buffer control circuit) that sets an output of a page buffer, connected to a defective memory cell or bit line, from among the page buffer 102*a*, to fixed data.

Also, when a memory cell or a bit line is defective, the page buffer control circuit does not allow writing from the first data bus.

Also, during the first operation mode, it is viewed as input data of the ECC circuit without a repair of a page buffer, corresponding to a defective memory cell or bit line, from among the page buffer 102*a* and the page buffer 102*b* that exist to perform a repair at the first operation mode and the second operation mode, respectively.

Also, if the number of bit lines is n (n being a common multiple of p and q being a natural number, p>q), the first data bus is q, and the second data bus is q. If (n/p) address signals are received at the first operation mode, the data transfer unit connects p bit lines to "p" lines of the first data bus. If (n/q) address signals are received at the second operation mode, the data transfer unit connects q bit lines to the second data bus. Although the number n of physical bit lines is not a common multiple of p and q, the rest may be used as dummy bit lines.

With the inventive concepts, since it is easy to widen a bus width of the ECC bus (first data bus) to the ECC circuit 107 (in this embodiment, a bus to the ECC circuit being a 300-bit-wide bus), also, a repair circuit (column repair circuit 104) of a main data unit is unnecessary on the ECC bus. For this reason, it is possible to implement a high-speed data transfer at ECC processing. Also, since the size of a repair circuit of the main data unit is not increased unlike a conventional technique, an increase in a chip size is suppressed and a cost corresponding to fabrication is lowered.

Also, in exemplary embodiments, there is described an embodiment where there is used a PCR repair system (parity column repair circuit 105) dedicated to a parity unit having a size smaller than a repair circuit of the main data unit. However, the inventive concepts are not limited thereto. Only, the parity column repair circuit 105 is useful to repair a defect of the parity unit. In the event that the parity column repair circuit 105 is not used, the error correction capacity is damaged. The reason is that an error is corrected by probability of 50% (0 or 1) per bit of column. In this behalf, as described above, the ECC correction capacity is improved by repairing a defect of the parity unit using the parity column repair circuit 105.

In a configuration of the NAND flash memory 10, PB_PCR102d (page buffer 102d) being a dedicated repair unit is required to repair a defect of a parity unit, thereby causing an increase in a chip size, an increase in a fabrication cost, and an increase in complexity of a system as an ECC system. For this reason, it may be considered to integrate a function of the page buffer 102d in the PB_CR102b (page buffer 102b). Also, a defective bit of a parity unit (page buffer 102c) is repaired using a column repair circuit 104 corresponding to Main Data at a first operation mode (ECC mode). Thus, a parity column repair circuit 105 of a NAND flash memory is unnecessary.

Figure 10:
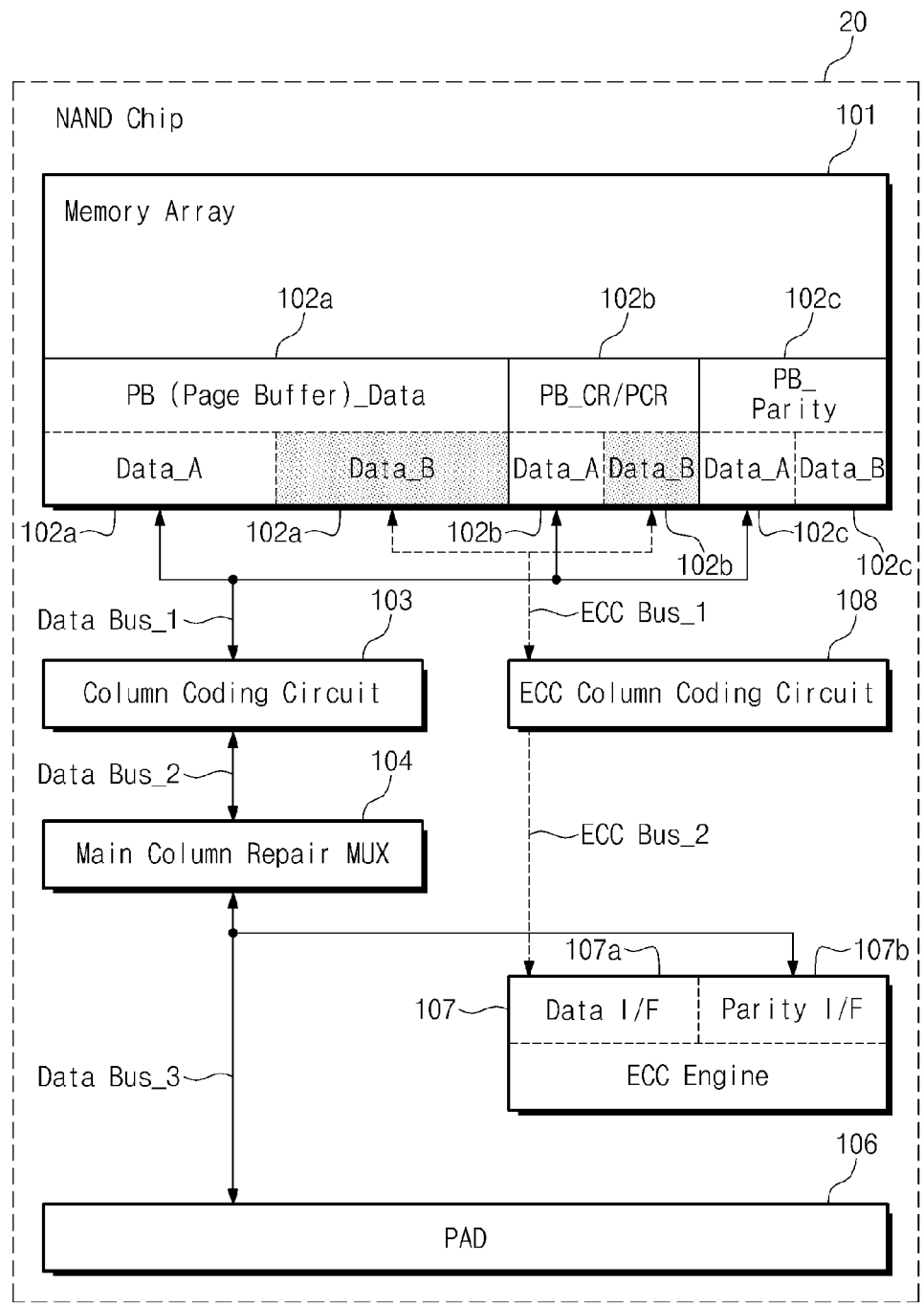
FIG. 10 is a diagram schematically illustrating a block configuration of a NAND flash memory.

FIG. 10 is a diagram schematically illustrating a block configuration of a NAND flash memory 20. In FIG. 10, components that are identical to those illustrated in FIG. 1 are marked by the same reference numerals, and a description thereof is thus omitted. The NAND flash memory 20 is different from that illustrated in FIG. 1 in that a page buffer 102d is eliminated. If one of page buffer units constituting a page buffer 102c is defective, it is replaced with one of page buffer units of a page buffer 102b.

Also, a defective bit of a parity unit is repaired by eliminating a parity column repair circuit 105 that is a repair circuit corresponding to a page buffer 102d illustrated in FIG. 1 and using a column repair circuit 104, which is used when a user accesses a page buffer 102a, as a repair circuit corresponding to a page buffer 102c.

In FIG. 10, an interface (input/output unit) of the page buffer 102a is illustrated to be separated from Data_A102a_A and Data_B102a_B. Here, Data_A102a_A is formed of a line (referred to as Data_A_In bus) of a data-in signal Data_In_A and a line (referred to as Data_B_In bus) of a data-out signal Data_Out_A of a PB unit illustrated in FIG. 4 or 5 and connects Data_Bus_1 (second data bus) and a PB control circuit 60 of a PB unit. Meanwhile, Data_A102a_B is formed of a line (referred to as Data_In_B bus) of a data-in signal Data_In_B and a line (referred to as Data_Out_B bus) of a data-out signal Data_Out_B and connects ECC_Bus_1 and the PB control circuit 60.

In FIG. 10, likewise, an interface (input/output unit) of the page buffer 102b is illustrated to be separated from Data_A102b_A and Data_B102b_B. Data_A102b_A is Data_A_In and Data_Out_A buses of the PB unit and connects Data and a CR/PCR selector 75 of the PB unit (refer to FIG. 12). Meanwhile, Data_A102b_B is Data_In_B and Data_Out_B buses and connects ECC_Bus_1 and the CR/PCR selector 75. A configuration of the PB unit will be described later.

In FIG. 10, likewise, an interface (input/output unit) of the page buffer 102c is illustrated to be separated from Data_A102c_A and Data_B102c_B.

Figure 11:
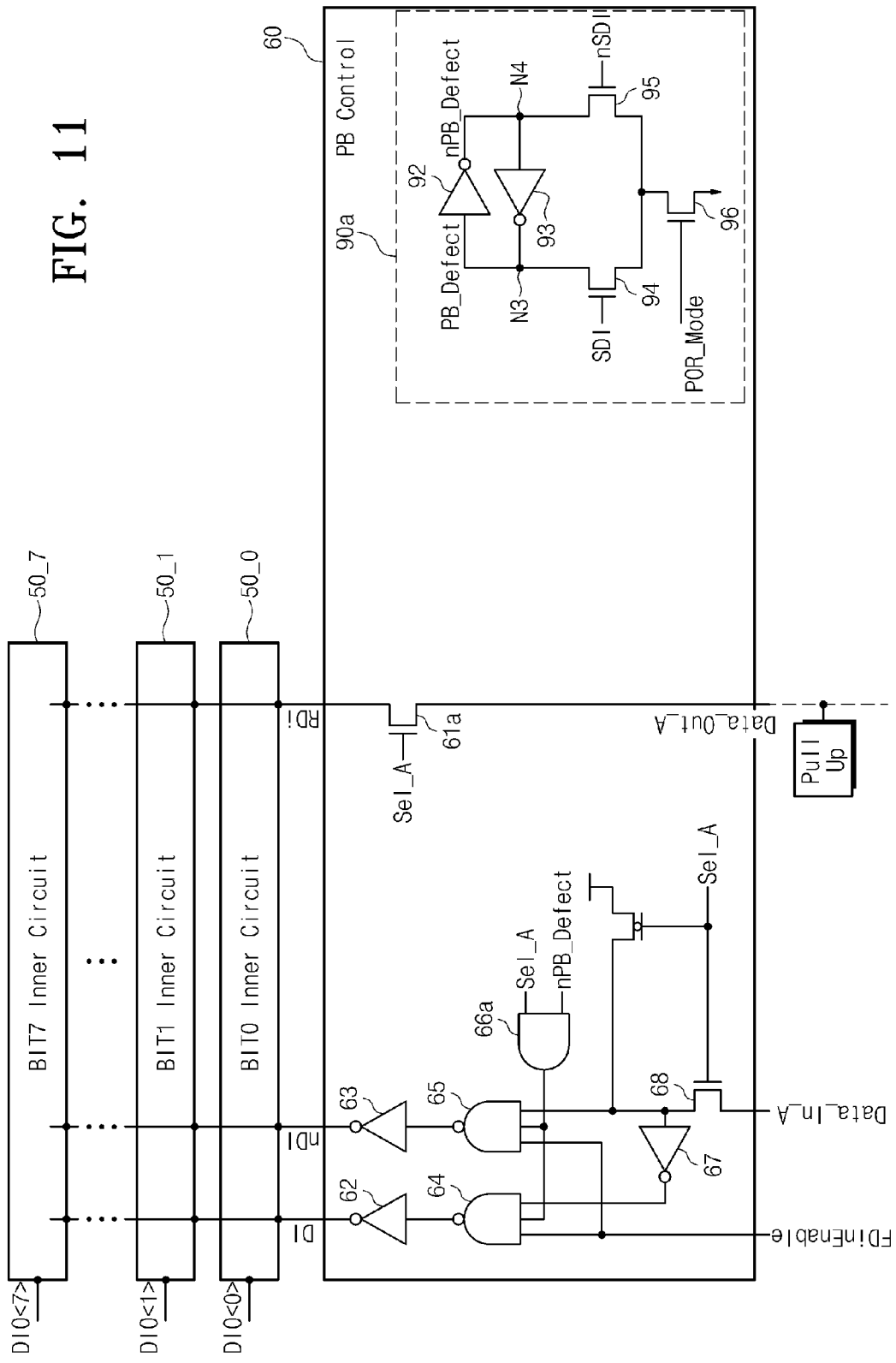
FIG. 11 is a diagram schematically illustrating an internal circuit configuration of a PB unit of a page buffer.

Data_A102c_A is Data_A_In and Data_Out_A buses and connects Data_Bus_1 to the PB control circuit 60 of the PB unit (refer to FIG. 11). Meanwhile, Data_B102c_B is Data_In_B and Data_Out_B buses. Although not illustrated in figures, Data_B102c_B may connect ECC_Bus_1 to the PB control circuit 60 of the PB unit. This may be implemented according to a configuration of the PB unit, and such connection may be possible (to be described in detail later).

In FIG. 10, an interface (input/output unit) of an ECC circuit 107 is illustrated to be separated from an input/output unit of main data: Data I/F107a and Parity I/F107b. Data I/F 107a is used to exchange a Data_B unit (Data_B102a_B and Data_B102b_B) of a PB unit group of the page buffer 102 and main data, associated with ECC processing, via ECC_Bus1 and ECC_Bus2. Meanwhile, Parity I/F 107b is used to exchange a Data_B unit (Data_A102b_A and Data_A102c_A) of the PB unit group of the page buffer 102 and parity data, associated with ECC processing, via Data_Bus_1 and Data_Bus_2.

Like a conventional case, an ECC data unit (PB units of the page buffers 102a and 102b) passes through ECC Bus at a first operation mode. Only, in an ECC parity unit (PB unit of the page buffer 102c), parity data passing through Data Bus is exchanged. Thus, a column repair circuit 105 illustrated in FIG. 1 is unnecessary. Further, data exchange among the ECC data unit, the ECC parity unit, and the ECC circuit 107 may be made at the same time.

Now will be described a configuration of each PB unit of the page buffers 102a to 102c.

First, a circuit configuration illustrated in FIG. 4 or 5 may be used with respect to a PB unit of the page buffer 102a.

FIG. 11 is a diagram schematically illustrating an internal circuit configuration of a PB unit of a page buffer 102c. In FIG. 11, components that are identical to those in FIGS. 4 and 5 are marked by the same reference numerals, and a description thereof is thus omitted.

A difference between a PB unit of FIG. 11 and a PB unit of FIG. 5 is as follows. The PB unit illustrated in FIG. 11 is different from the PB unit of FIG. 5 in that transistors 61b and 61c, a switch 69, a PMOS transistor to pull up an input of an inverter circuit 67, and an AND circuit 71 are eliminated. Also, a selection signal Sel_B is not applied to the PB unit of FIG. 11. An AND circuit 66a illustrated in FIG. 11 corresponds to an OR circuit 66, and a first input terminal of the AND circuit 66a is connected to a line of a selection signal Sel_A.

Likewise, a PB unit of a page buffer 102c may take a configuration in which a portion associated with Data_In_B and Data_Out_B buses is skipped as illustrated in FIG. 11.

Where a PB unit has a configuration illustrated in FIG. 4 or 5, a selection signal Sel_B may be fixed to a low level such that Data_In_B and Data_Out_B buses are not used. In this case, Data_B102c is Data_In_B and Data_Out_B buses and is an interface for connecting ECC_Bus_1 and a PB control circuit 60 of a PB unit. Only, connection between ECC_Bus_1 and the PB control circuit 60 of the PB unit may not be made actually.

Figure 12:
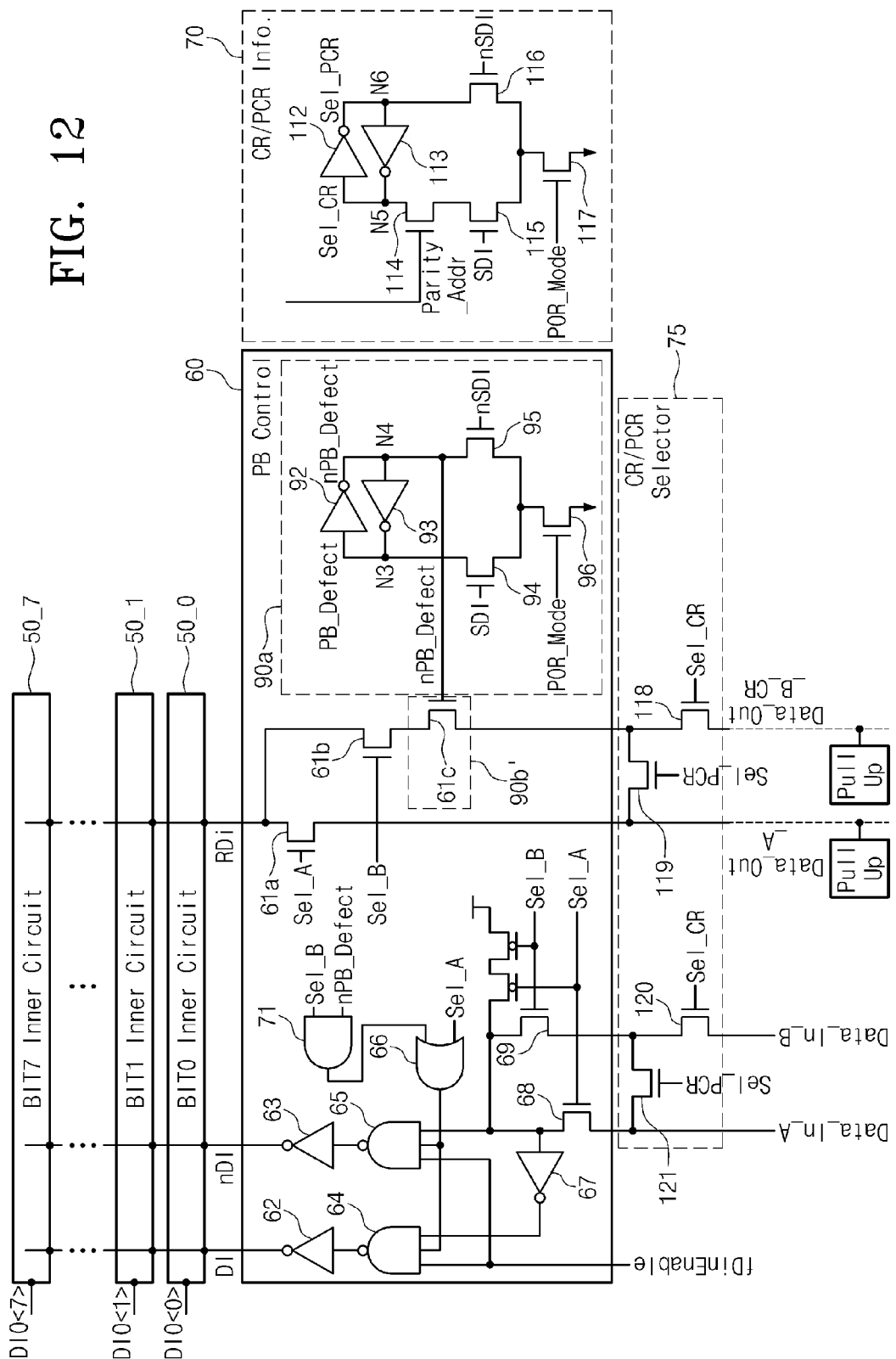
FIG. 12 is a diagram schematically illustrating an internal circuit configuration of a PB unit of a page buffer.

FIG. 12 is a diagram illustrating an internal circuit configuration of a PB unit of a page buffer 102b. In FIG. 12, components that are identical to those in FIG. 5 are marked by the same reference numerals, and a description thereof is thus omitted. A PB unit illustrated in FIG. 12 is different from that illustrated in FIG. 5 in that it further comprises a CR/PCR information storing unit 70 and a CR/PCR selector 75. The CR/PCR information storing unit 70 may store information indicating whether the PB unit is assigned to correspond to CR (to repair a PB unit of a page buffer, that is, to repair a defective bit of Main) or corresponding to PCR (to repair a PB unit of a page buffer, that is, to repair a defective bit of Parity). Also, the CR/PCR selector 75 switches connection with a read ECC data bus or a write ECC data bus, based on information stored in the CR/PCR information storing unit 70: information indicating whether the PB unit is assigned to correspond to CR or to correspond to PCR.

Now will be described a circuit configuration of the CR/PCR information storing unit 70 and a data latch operation when a power is supplied to the CR/PCR information storing unit 70, with reference to FIG. 12. Here, the data latch operation is exemplary. As an example, there will be described an operation in which defect information associated with a selection signal Sel_A is stored in a system storage area of a NAND flash memory 20 and is transferred to a latch corresponding to a defect information storing unit 90a and the CR/PCR information storing unit 70. Since a circuit configuration of the defect information storing unit 90a is described with reference to FIGS. 4 and 5, its description is omitted.

The CR/PCR information storing unit 70 includes inverter circuits 112 and 113 and transistors 114, 115, 116, and 117. Here, the transistors 114 to 117 may be an NMOS transistor.

A latch unit of the CR/PCR information storing unit 70 is formed of the inverter circuits 112 and 113. Here, an output terminal of the inverter circuit 112 and an input terminal of the inverter circuit 113 are connected to a connection node N6, and an input terminal of the inverter circuit 112 and an output terminal of the inverter circuit 113 are connected to a connection node N5.

Data that the latch unit stores may appear on the connection node N5 as a switch signal Sel_CR to perform a connection control of a CR/PCR selector 75. Also, data that the latch unit stores may appear on the connection node N6 as a switch signal Sel_PCR to perform a connection control of the CR/PCR selector 75.

A sensing unit of the CR/PCR information storing unit 70 is formed of the transistors 114 to 117.

The transistor 114 has a drain connected to the connection node N5, a gate connected to receive a parity address signal Parity_Addr (signal having a high level when an address corresponding to a defect exists within a Parity area), and a source connected to the transistor 115.

The transistor 115 has a drain connected to a source of the transistor 114, a gate connected to receive a defect information signal SDI, and a source connected to a drain of the transistor 117.

The transistor 116 has a drain connected to the connection node N6, a gate connected to receive a defect information signal nSDI, and a source connected to the drain of the transistor 117.

A drain of the transistor 117 is connected to the source of the transistor 115 and the source of the transistor 116, a gate thereof is connected to receive a power-on reset signal POR_Mode, and a source thereof is grounded.

Here, the detect information signals SDI and the nSDI may be used to indicate whether a bit line connected to the PB control circuit 60 or a memory cell transistor connected to the bit line is defective. The defect information signal SDI and the defect information signal nSDI are set to a low level (data 0) and a high level (data 1) if a test result indicates that a bit line connected to the PB control circuit 60 is defective. The defect information signal SDI and the defect information signal nSDI are set to a high level and a low level a test result indicates that a bit line connected to the PB control circuit 60 is not defective. Such defect information signals may be associated with a selection signal indicating a location of the PB control circuit 60 and is stored in a system storage area of a NAND flash memory 20, for example.

Also, the power-on reset signal POR_Mode may be a signal that maintains a high level during a predetermined time (time when the defect information signal is transferred to the PB control circuit 60 from the system storage area) after the NAND flash memory 20 is powered on.

With the above configuration, where a bit line connected to the PB control circuit 60 is defective, the power-on reset signal POR_Mode and the parity address signal Parity_Addr are set to a high level when a power is supplied to the NAND flash memory 20. At this time, in the defect information storing unit 90a and the CR/PCR information storing unit 70, the transistor 94 and one of the transistors 115 and 116 are turned off and the transistor 95 and the other of the transistors 115 and 116 are turned on. Since the node N3 and one of the nodes N5 and N6 are set to a high level and the node N4 and the other thereof are set to a low level, the defect signal PB_Defcet and one of switch signals Sel_CR and Sele_PCR have a high level. After a transfer period is ended, the power-on reset signal POR_Mode is set to a low level. While a power is supplied to the NAND flash memory 20, the defect signal PB_Defcet and one of the switch signals Sel_CR and Sele_PCR maintain a high level.

Also, where a bit line connected to the PB control circuit 60 is not defective, the power-on reset signal POR_Mode is set to a high level when the NAND flash memory 20 is powered up. At this time, a transistor 94 is turned on, and a transistor 95 is turned off. As the node N3 is set to a low level and the node N4 is set to a high level, the defect signal PB_Defcet transitions to a low level. After a transfer period is ended, the power-on reset signal POR_Mode is set to a low level. The defect signal PB_Defcet maintains a low level while a power is supplied to the NAND flash memory 20.

In the CR/PCR information storing unit 70, an initial value on a latch operation after power-up is set such that the node N5 (switch signal Sel_CR) has a high level. Since the power-on reset signal POR_Mode is set to a high level, the transistor 115 is turned on and the transistor 116 is turned off. In this case, if the parity address signal Parity_Addr has a high level (high level when a defect bit address of a repair source of a PB unit (CR/PCR unit) exists within a Parity area), the node N5 (switch signal Sel_CR) is set to a low level and the node N6 (switch signal Sel_PCR) is set to a high level. Meanwhile, if the parity address signal Parity_Addr has a low level (low level when a defect bit address of a repair source does not exist within a Parity area), the node N5 (switch signal Sel_CR) is set to a high level and the node N6 (switch signal Sel_PCR) is set to a low level. Referring to the defect information storing unit 90a, after a transfer period is ended, the power-on reset signal POR_Mode is set to a low level. In this case, the defect signal PB_Defcet retains a low level while a power is supplied to the NAND flash memory 10.

As described above, the CR/PCR information storing unit 70 operates such that the switch signal Sel_CR is set to a high level when a PB unit is set as a PB unit to correspond to CR and such that the switch signal Sel_PCR is set to a high level when a PB unit is set as a PB unit to correspond to PCR.

A CR/PCR selector 75 has the following circuit configuration. The CR/PCR selector 75 includes transistors 118, 119, 120, and 121. The transistors 118, 119, 120, and 121 may be an NMOS transistor.

In the transistor 118, a drain is connected to a source of a transistor 61c, a gate is connected to receive the switch signal Sel_CR, and a source is connected to Data_Out_B_CR bus (line to transfer a data-out signal Data_Out_B_CR).

One of a source and a drain of the transistor 119 is connected to Data_Out_A bus (line to transfer a data-out signal Data_Out_A), and the other thereof is connected to the drain of the transistor 118. A gate of the transistor 119 is connected to receive a switch signal Sel_PCR.

In addition, pull-up circuits are connected to Data_Out_A and Data_Out_B buses.

The transistor 120 has a drain connected to a source (second input terminal of a switch 69 in FIG. 5) of a transistor 69, a gate connected to receive a switch signal Sel_CR, and a source connected to the Data_In_B bus (line to transfer a data-in signal Data_In_B).

One of a source and a drain of the transistor 121 is connected to Data_In_A bus (line to transfer a data-in signal Data_In_A), and the other thereof is connected to the drain of the transistor 120. A gate of the transistor 121 is connected to receive a switch signal Sel_PCR.

The CR/PCR information storing unit 70 and the CR/PCR selector 75 may be illustrated as being added to a PB unit illustrated in FIG. 5. However, the inventive concept is not limited thereto. For example, the CR/PCR information storing unit 70 and the CR/PCR selector 75 may be added to a PB unit illustrated in FIG. 4. It is unnecessary to dispose the CR/PCR information storing unit 70 and the CR/PCR selector 75 in a PB unit. For example, the CR/PCR information storing unit 70 and the CR/PCR selector 75 may be disposed as being independent from the PB unit. The CR/PCR information storing unit 70 may be implemented with other equivalent logical circuit, for example, a flip-flip.

Now will be described an operation of a PB unit with the above-described configuration. Also, where the PB unit is used as a PB unit to correspond to CR by setting it as a PB unit to correspond to CR, the NAND flash memory 20 operates the same as a NAND flash memory 10; therefore, a description thereof is thus omitted. There will be described an example where the PB unit is used as a PB unit to correspond to PCR by setting it as a PB unit to correspond to PCR.

If a PB unit is used as a PB unit to correspond to PCR, as described above, data is latched that sets a switch signal Sel_PCR to a high level. In this case, if a PB control circuit 60 is accessed at a first operation mode (ECC operation mode using a selection signal Sel_B), a data-in signal Data_In_A is provided to the PB control circuit 60 via a transistor 121 at a data write operation, and a data-in signal Data_In_B is ignored. At a data read operation, data from the PB control circuit 60 is output onto Data_Out_A thus via a transistor 119, and simultaneously, a fixed value is output onto Data_Out_B bus through a pull-up circuit.

Meanwhile, in case of a second operation mode (normal operation mode using the selection signal Sel_A), like a NAND flash memory 10, the PB control circuit 60 exchanges data with the Data_In_A bus at a data write operation and with the Data_Out_A bus at a data read operation.

FIG. 13 is a diagram illustrating how data is exchanged using either one of Data Bus and ECC Bus, based on data retained in a CR/PCR information storing unit 70. As described above, in a NAND flash memory 20, it is important to make a PB unit of a page buffer 102b of FIG. 12 operate using a data bus illustrated in FIG. 13 based on data that a CR/PCR information storing unit 70 retains. In addition, the PB unit illustrated in FIG. 12 is an exemplary PB unit that is configured to accomplish operations illustrated in FIG. 13 using MOS switches (transistors 119 and 121). However, the inventive concept is not limited thereto. For example, it is possible to perform the same function using logic circuits instead of MOS switches.

Now will be described an operation of a NAND flash memory 20 with reference to accompanying drawings.

FIGS. 14A-14B are diagrams illustrating each page buffer of a page buffer 102 of a NAND flash memory device 20.

FIG. 14A illustrates a relation between an ECC code and a PB unit in a NAND flash memory 20 according to an embodiment of the inventive concept. In exemplary embodiments, 320 PB units exist. Since a PB unit is assigned to an address 1 in an address space of Add_A, 0 to 319 addresses Add_A (selection signal Sel_A to select a PB unit: second selection address) are assigned to PB units 0 to 319, respectively.

Here, PB units 0 to 255 (page buffer 102a) constitute an area in which main data is written and read by a user. PB units 256 to 287 (page buffer 102b) are PB units corresponding to CR/PCR and are used to repair defective bit lines of a page buffer 102a or 102c. PB units 288 to 319 constitute an ECC parity area (page buffer 102c). Here, an ECC data unit of an ECC code is formed of data of the PB units 0 to 287, and a parity unit is formed of data of the PB units 288 to 319.

FIG. 14B illustrates an example in which PB units 1 and 289 are PB units including defective bits and are repaired with a PB unit 256 and a PB unit 287 corresponding to CR/PCR, respectively.

Figure 15:
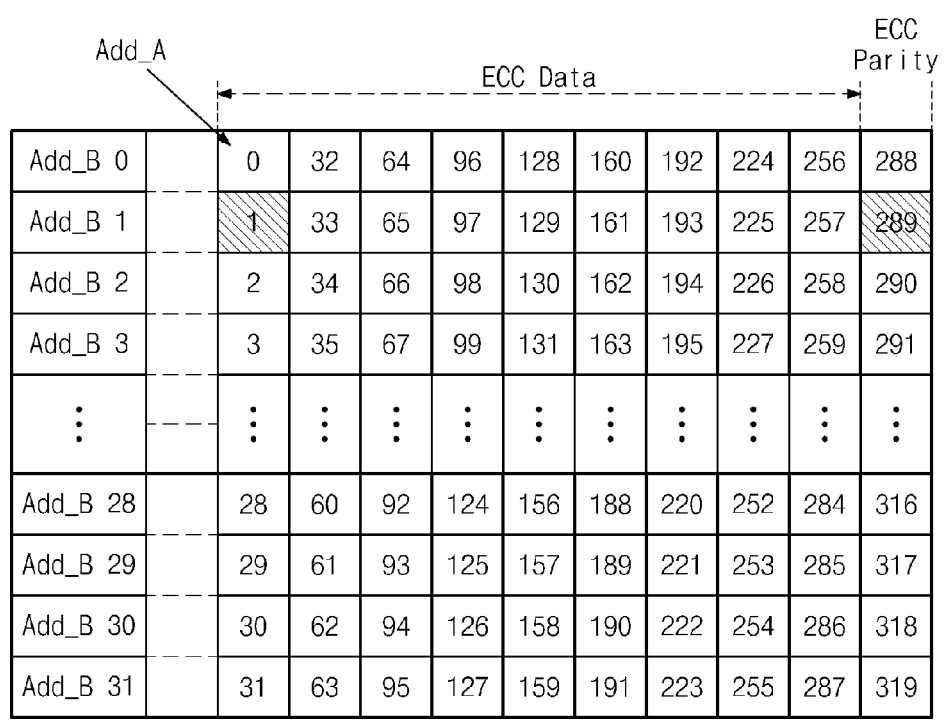
FIG. 15 is a diagram schematically illustrating address spaces Add_A and Add_B.

FIG. 15 is a diagram schematically illustrating address spaces Add_A and Add_B. One address Add_B (selection signal Sel_B to select a PB unit: first selection address) is assigned to the address space Add_B by arranging PB units. For example, in Add_B_0 ($0^{th}$ of an Add_B space), one address is used to select 10 PB units 0, 32, 64, 96, 128, 160, 192, 224, 256, and 288 included in the Add_A space. In Add_B_1, one address is used to select 10 PB units 1, 33, 65, 97, 129, 161, 193, 225, 257, and 289 included in the Add_A space. 320 accesses are made when data is transferred between PB units 0 to 319 of a page buffer 102 and an ECC circuit using Add_A, but 32 accesses are made if a data transfer is executed using Add_B.

In addition, one address is formed of one bit for simplification using Add_A, but one address can be formed of, but not limited to, eight bits (8 IO) or 16 bits (16 IO). This may be accomplished by preparing PB units as many as the number of bits. Also, an address space may be modified. For example, there may be included a configuration capable of enabling a parallel operation of plural addresses by disposing a plurality of PB units.

Figure 16A:
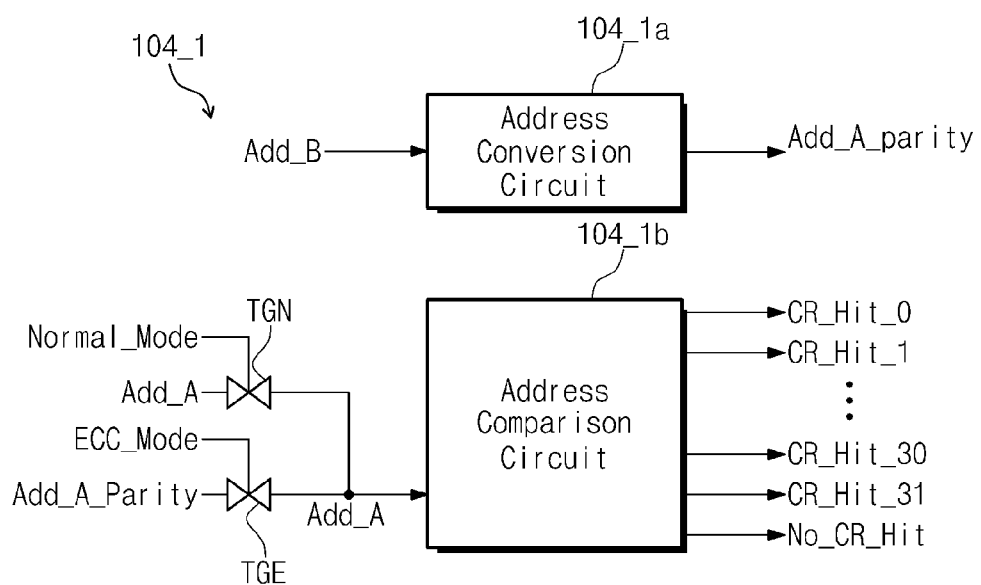
FIGS. 16A-16B are diagrams schematically illustrating a configuration of a column repair circuit of a NAND flash memory.
Figure 16B:
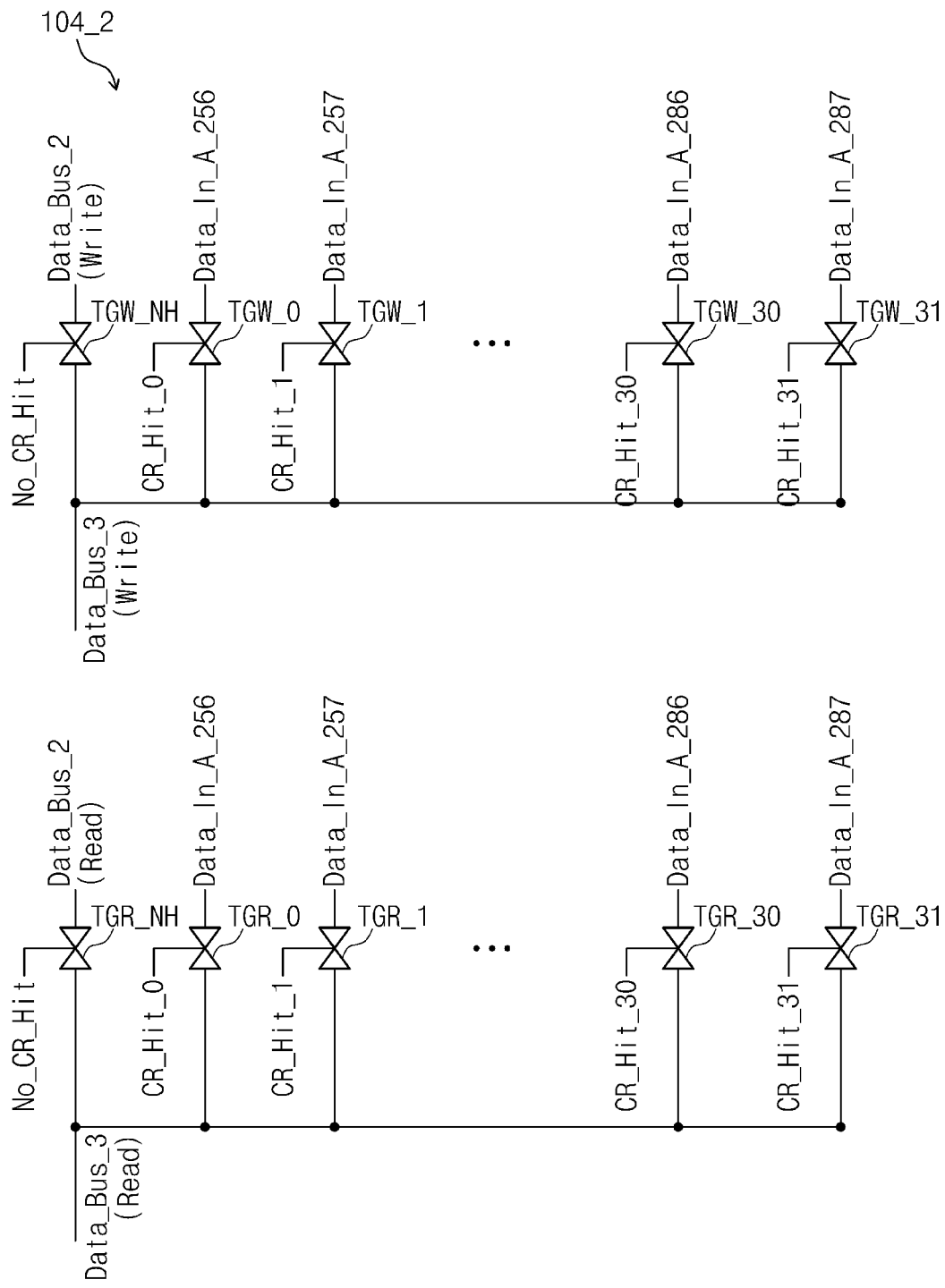

FIGS. 16A-16B are diagrams schematically illustrating a configuration of a column repair circuit 104 of a NAND flash memory 20.

A column repair circuit 104 is formed of an address comparison unit 104_1 illustrated in FIG. 16A and a data bus switching unit 104_2 illustrated in FIG. 16B.

The address comparison unit 104_1 includes an address conversion circuit 104_1a, an address comparison circuit 104_1b, transfer gates TGN and TGE.

The address conversion circuit 104_1a compares an input address Add_A with defect bit information retained therein. If matched, the address conversion circuit 104_1a outputs a CR_Hit signal of a corresponding repair place. Meanwhile, if not matched, the address conversion circuit 104_1a outputs information indicating "miss", for example, a NO_CR_Hit signal having a high level.

In response to a high level of mode signal Normal_Mode received at a normal operation mode (second operation mode), the transfer gate TGN passes Add_A (selection signal Sel_A) to transfer an address Add_A to the address conversion circuit 104_1a.

Meanwhile, in response to a high level of mode signal ECC_Mode received at an ECC operation mode (first operation mode), the transfer gate TGE passes Add_A_Parity to transfer an address Add_A to the address conversion circuit 104_1a.

The address conversion circuit 104_1b converts Add_B (selection signal Sel_B) into Add_A_Parity being a value of an Add_A space of ECC_Parity and outputs Add_A_Parity to the transfer gate TGE.

The data bus switching unit 104_2 incorporates transfer gates TGW_NH, TGW_0 to TGW_31, TGR_NH, and TGR_0 to TGR_31.

In response to corresponding CR_Hit signals received from the address conversion circuit 104_1a, the transfer gates TGW_NH and TGW_0 to TGW_31 connect Data_Bus_3 (Write) to Data_Bus_2 (Write) or one of Data_In_A_256 to Data_In_A_287 buses of a repair place. Here, Data_Bus_2 (Write) and Data_Bus_3 (Write) are lines to transfer data-in signals of Data_Bus_2 and Data_Bus_3 illustrated in FIG. 10, respectively. Data_In_A_256 to Data_In_A_287 buses are Data_In_A buses of PB units 256 to 287 (refer to FIG. 12).

In response to corresponding CR_Hit signals received from the address conversion circuit 104_1a, the transfer gates TGW_NH and TGR_0 to TGR_31 connect Data_Bus_3 (Read) to Data_Bus_2 (Read) or one of Data_Out_A_256 to Data_Out_A_287 buses of a repair place. Here, Data_Bus_2 (Read) and Data_Bus_3 (Read) are lines to transfer data-out signals of Data_Bus_2 and Data_Bus_3 illustrated in FIG. 10, respectively. Data_Out_A_256 to Data_Out_A_287 buses are Data_Out_A buses of PB units 256 to 287 (refer to FIG. 12).

As described above, a NAND flash memory 20 does not need a redundancy area (page buffer 102d illustrated in FIG. 1) dedicated to parity. Also, the NAND flash memory 20 does not need a parity column repair circuit 105 that repairs a defect bit of a parity unit (page buffer 102c) with a PB unit (page buffer 102b) to perform CR/PCR repair. Now will be described an ECC operation mode (first operation mode) of a NAND flash memory device 20.

(Encoding)

To avoid duplication with a description of a NAND flash memory 10, it is assumed that an encoding operation is executed under a condition where a user inputs data via an I/O pad 106 and data is stored in each PB unit.

At an encoding operation, data stored in a PB unit is transferred to an ECC circuit 107, and the ECC circuit 107 generates parity data in response to input data. The parity data is written back in the PB unit.

In an Add_B space, data of 10 PB units may be transferred to the ECC circuit 107 at the same time as understood from FIG. 15. Here, data of 9 PB units of an ECC data unit (page buffers 102a and 102b) is transferred via ECC_Bus_1 and ECC_Bus_2 using a path where a defect bit repair is not made.

In a PB unit of an ECC_Parity unit (page buffer 102c), a defect bit is transferred via Data_Bus_1, Data_Bus_2, and Data_Bus_3 such that a column repair circuit 104 repairs it with a normal bit.

For a detailed description, a data transfer of Add_B_1 illustrated in FIG. 15 will be described. Data stored in PB units 1, 33, 65 ... 225, and 257 of an Add_A space illustrated in FIG. 15 is transferred via ECC_Bus, but the PB unit 1 outputs a fixed value because it includes a defect bit. Since a defective PB unit 289 is included in the ECC_Parity unit (page buffer 102c), a fixed value is applied to the column repair circuit 104 from a Data_A unit of a PB unit (interface unit) via Data_Bus_1 and Data_Bus_2.

A PB unit 287 that is to be assigned as a repair place of the PB unit 289 provides data to the column repair circuit 104 from Data_Out_A bus via Data_Bus_1 and Data_Bus_2 because a switch signal Sel_PCR illustrated in FIG. 12 is at a high level.

Here, an address 289 of the Add_A space is applied to the column repair circuit 104, and 289 of the Add_A space is set such that it is repaired with 287. Thus, data of the PB unit 289 is repaired with the PB unit 287 to be transferred to the ECC circuit. Here, a transfer operation can be skipped because parity data is not yet generated.

An operation of transferring data to the ECC circuit is completed by iterating the above-described operation up to Add_B_31, so that parity is generated. As described above, since the PB unit 287 is assigned as a repair place of ECC_Parity, a fixed value is output to Data_Out_B bus if it is read as ECC_Data in case of Add_B_31. The reason is that in FIG. 12, a switch signal Sel_PCR has a high level and a switch signal Sel_CR has a low level. As a result, a fixed value is read in an ECC data unit of the ECC circuit 107.

An operation where parity data is generated and is written back in a PB unit may be performed using the same path. In Add_B_1, it is unnecessary to perform a write-back operation on ECC_Data. However, if a write-back operation on ECC_Data is performed, a write operation on a PB unit 1 including a defect bit is inhibited. Meanwhile, data is written back in PB units 33, 65 ... 225, and 257. Parity data Ecc_Parity is output from the ECC circuit 107 onto Data_Bus_3 as illustrated in FIG. 10.

In the column repair circuit 104, as illustrated in FIG. 15, since a value of an Add_A space of ECC_Parity is 289 in case of Add_B_1, Add_B indicates 1 and Add_A_Parity indicates 289. This value is used as Add_A and is provided to an address comparison circuit 104_1a of an address comparison unit 104_1. As illustrated in FIG. 14B, 289 is a defect bit and is repaired with 287. Thus, the address comparison circuit 104_1a outputs information indicating that an address corresponds to defect bit information. Based on the comparison result, the address comparison circuit 104_1a sets CR_Hit_31 to a high level and the rest to a low level.

CR_Hit_31 is provided to a transfer gate TGW_31 illustrated in FIG. 16B, and the transfer gate TGW_31 connects Data_Bus_3 (Write) and Data_In_A_287 bus.

Thus, parity data from an ECC circuit 107 is repaired by providing the column repair circuit 104 with an address converted from the Add_B space to the Add_A space. Where a repair operation does not occur, No_CR_Hit is set to a high level and the rest is set to a low level. Thus, Data_Bus_3 (Write) and Data_Bus_2 are electrically connected. This means that data is provided from ECC_Bus_2 to a column coding circuit 103. Since a value Add_A of the Add_A space of ECC_Parity is provided as an address applied to the column coding circuit 103, as illustrated in the column repair circuit 104, a PB unit for corresponding parity is selected and parity is stored therein.

(Decoding)

At a decoding operation, data that is stored in a PB unit and read from a memory cell array is transferred to an ECC circuit 107, and error-corrected data is written back in the PB unit. A data transfer from the PB unit to the ECC circuit 107 is performed in a similar manner that is described at an encoding operation, and a description thereof is appropriately omitted. Data of a PB unit of an ECC_Parity unit is transferred via Data_Bus_1, Data_Bus_2, and Data_Bus_3, and a column repair circuit 104 repairs a defect bit with a normal bit. This operation may not be performed at the encoding operation, but it is necessary to transfer all parity units to the ECC circuit 107 correctly at the decoding operation.

A data transfer of Add_B_1 will be described in detail. Add_B input in an address conversion circuit 104_1b of FIG. 16A is 1, and Add_A_Parity converted as illustrated in FIG. 5 is 289. At this time, a mode signal ECC_Mode is at a high level, and 289 is applied to an address comparison circuit 104_1a. Since 289 of Add_A corresponds to a defect bit address, the address comparison circuit 104_1a sets CR_Hit_31 to a high level and the rest to a low level. A bus switching unit 104_2 illustrated in FIG. 6A switches data of a PB unit 289 of Add_A; therefore, data originally retained in the PB unit 287 is output to ECC_Bus_3 and transferred to the ECC circuit 107.

An operation of transferring data to the ECC circuit 107 is ended by iterating the above-described operation up to Add_B_31. After an error is corrected, error-corrected data is written back in the PB unit. This operation is equal to a write-back operation at encoding, and a description thereof is thus omitted.

There is described an example where an error of data is corrected and error-corrected data is written back in a PB unit. However, the inventive concept is not limited thereto. To a PB unit is provided data that has a high level when an error bit is detected and a low level when an error bit is not detected, and the PB unit executes an exclusive logical operation on data read from a memory array and error-detected data such that an error-detected bit is only inverted.

A NAND flash memory 20 includes ECC Bus (first data bus) and Data Bus (second data bus). The second data bus is different in number from the first data bus and is independent from the first data bus. The NAND flash memory 20 comprises a page buffer 102 (data transfer unit) that, during a first operation mode, connects bit lines of which the number is equal to the number of lines of the first data bus, to the first data bus to transfer data. Meanwhile, the a page buffer 102 (data transfer unit) connects bit lines of which the number is equal to the number of lines of the second data bus, to the second data bus to transfer data, during a second operation mode.

The data transfer unit includes a page buffer 102a (first page buffer) to latch data of a normal bit line connected to a normal memory cell and a page buffer 102c (second page buffer) to latch data of a parity bit line connected to a parity memory cell. If a normal memory cell or a normal bit line connected to the first page buffer is defective, a page buffer (third page buffer) may be repaired together with the normal memory cell and the normal bit line. Or, if a parity memory cell or a parity bit line connected to the second page buffer is defective, the page buffer (third page buffer) may be repaired together with the parity memory cell and the parity bit line. The first data bus is connected to the first to third page buffers, and the second data bus is connected to the first and third page buffers.

In the page buffer 102b (third page buffer) is previously stored identification data indicating whether it is used to repair a first page buffer or a second page buffer. The page buffer 102b operates as the first page buffer or the second page buffer according to the identification data.

The NAND flash memory 20 includes an ECC circuit 107 and a parity column repair circuit 105. The ECC circuit 107 is connected to the first data bus and corrects of output data of the first page buffer provided to a data input/output unit based on output data of the second page buffer provided to a parity data input/output unit. The parity column repair circuit 105 is connected to the first data bus and repairs a page buffer, associated with a defective parity memory cell or parity bit line, of the second page buffer with the third page buffer at an ECC mode.

In case the identification data (switch signal Sel_PCR) indicates a repairing place of the second page buffer, the third page buffer that is selected at a data read operation of a first operation mode outputs fixed data to a data input/output unit of the ECC circuit 107 via the Data_Out_B_CR bus (first data bus) and parity data to a parity data input/output unit of the ECC circuit 107 via the Data_Out_B_PCR bus (first data bus) and the parity column repair circuit (repair circuit) 105.

Meanwhile, the third page buffer that is selected at a data write operation of the first operation mode receives parity data from the parity data input/output unit of the ECC circuit 107 without allowing a write operation of a data-in signal Data_In_CR (data) from a data input/output unit of the ECC circuit 107.

Effects of the NAND Flash Memory 20 are as Follows.

(1) Since a repair area for parity PCR (page buffer 102d of a NAND flash memory 20) is unnecessary, a design cost and a test cost are lowered. Also, since an area is reduced, a cost decreases.

(2) Since a repair means for parity (a parity column repair circuit 105 of the NAND flash memory 20) is unnecessary, a design cost and a test cost are lowered. Also, since an area is reduced, a cost decreases.

(3) In addition to effects (1) and (2), it is possible to read or write an ECC_Data unit and an ECC_Parity unit at the same time. Thus, it has predominance in terms of processing speed.

(4) When ECC is executed only using an Add_A space, as described with reference to FIG. 15, 320 read operations and 320 write operations are executed. In case of the inventive concept, since 32 read operations and 32 write operations are executed, a time is reduced as much as $\frac{1}{10}$. A processing time is variable according to address assignment, but it is shortened more and more by widening a bus width of Add_B, for example.

(5) When an address Add_B corresponding to ECC is assigned, ECC_Parity is set to Add_B without restriction within a range where Add_A is assigned to a column repair circuit 104.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A semiconductor memory device, comprising:
a first data bus;
a second data bus being independent from the first data bus, the number of lines of the first data bus being different from that of the second data bus; and
a data transfer unit to transfer data by connecting the first data bus with bit lines, the number of which is equal to the number of lines of the first data bus, from among a plurality of bit lines when data is transferred at least one of to and from memory cells during a first operation mode and transfers data by connecting the second data bus with bit lines, the number of which is equal to the number of lines of the second data bus, from among the plurality of bit lines when data is transferred to/from memory cells during a second operation mode,
wherein the data transfer unit comprises:
a first page buffer to latch data of a normal bit line connected to a normal memory cell;
a second page buffer to latch data of a parity bit line connected to a parity memory cell; and
a third page buffer that is replaced together with a normal memory cell and a normal bit line when a normal memory cell or a normal bit line connected to the first page buffer is defective or is replaced together with a parity memory cell and a parity bit line when a parity memory cell or a parity bit line connected to the second page buffer is defective,
wherein the first data bus is connected to the first and third page buffers and the second data bus is connected to the first, second, and third page buffers.

2. The semiconductor memory device of claim 1, wherein the third page buffer previously stores identification data indicating whether either one of the first and second page buffers is replaced and operates as the first page buffer or the second page buffer in response to the identification data.

3. The semiconductor memory device of claim 1, further comprising:
   an ECC circuit which corrects an error of output data of the first page buffer input in a data input/output unit connected to the first data bus based on output data of the second page buffer input in a parity data input/output unit connected to the second data bus; and
   a repair circuit which is connected to the second data bus and repairs a page buffer, associated with a defective memory cell or bit line, of the first page buffer at the second operation mode,
   wherein when the identification data of the third page buffer indicates that a repair target of the second page buffer is repaired, the repair circuit selects the second page buffer as the repair target at the first operation mode and converts a first selection address of the first operation mode into a second selection address of the second operation mode when the first selection address is received,
   wherein the second selection address converted is compared with a second selection address of a second operation mode predetermined with respect to the second page buffer, wherein when the comparison result indicates "Hit", the third page buffer as a repair place is connected to the second data bus,
   wherein the third page buffer as a repair place outputs fixed data to the first data bus and parity data to the second data bus at a data read operation of the first operation mode, and at a data write operation of the first operation mode, writing of parity data from the second data bus is allowed and writing of data from the first data bus is inhibited.

4. The semiconductor memory device of claim 3, wherein the first page buffer includes a page buffer control circuit to set an output of a page buffer, connected to a defective memory cell or bit line, to fixed data and the page buffer control circuit inhibits an input from the first data bus when a memory cell or a bit line is defective.

5. A semiconductor memory device, comprising:
   a data transfer unit including a first page buffer to store normal data, a second page buffer to store parity data, and a third page buffer operating as a selected page buffer unit in the first and second page buffers to act as a shared page buffer at a repair operation on a defective column; and
   a repair circuit used in common when a defective page buffer unit in the first and second page buffers is repaired with a page buffer unit in the third page buffer.

6. The semiconductor memory device of claim 5, further comprising:
   an ECC circuit to correct an error of output data of the first page buffer input in a data input/output unit connected to a first data bus connected with the first and third page buffers, based on output data of the second page buffer input in a parity data input/output unit connected to a second data bus independent of the first data bus.

7. The semiconductor memory device of claim 6, wherein in the third page buffer is previously written identification data indicating whether a page buffer unit of either one of the first and second page buffers is repaired.

8. The semiconductor memory device of claim 7, wherein the repair circuit comprises:
   an address comparison unit which selects the second page buffer at a first operation mode and converts a first selection address of the first operation mode into a second selection address of a second operation mode, when the identification data of the third page buffer indicates that the second page buffer is used as a repairing placed; and
   a data bus switching unit which enables the third page buffer to output fixed data to the first data bus and parity data to the second data bus at a data read operation of the first operation mode and enables the third page buffer to inhibit data writing from the first data bus and to allow writing of parity data from the second data bus at a data write operation of the first operation mode.

9. The semiconductor memory device of claim 8, wherein the address comparison unit comprises:
   an address comparison circuit to compare the first selection address with stored defect bit information and generate a column repair hit signal when the first selection address corresponds to the stored defect bit information; and
   an address conversion circuit to convert the first selection address received at the first operation mode into the second selection address of the second operation mode.

10. The semiconductor memory device of claim 8, wherein the repair circuit, during a first operation mode, connects first bit lines of a plurality of bit lines to the first data bus such that data is transferred, the number of the first bit lines being equal to the number of bus lines of the first data bus, and
   wherein the repair circuit, during a second operation mode, connects second bit lines of the plurality of bit lines to the second data bus such that data is transferred, the number of the second bit lines being equal to the number of bus lines of the second data bus that is independent of the first data bus.

11. The semiconductor memory device of claim 8, wherein the second data bus is connected to the first and third page buffers.

12. The semiconductor memory device of claim 11, wherein the number of buses of the second data bus is more than that of the ECC bus.

13. The semiconductor memory device of claim 8, wherein the third page buffer is repaired together with a normal memory cell and a normal bit line when the normal memory cell or the normal bit line connected to the first page buffer is defective, and
   wherein the third page buffer is repaired together with a parity memory cell and a parity bit line when the parity memory cell or the parity bit line connected to the second page buffer is defective.

14. The semiconductor memory device of claim 8, wherein the number of page buffer units in the third page buffer is less than that of the second page buffer.

15. The semiconductor memory device of claim 8, wherein the repair circuit repairs a page buffer unit of the first page buffer, associated with a defective memory cell or a defective bit line, with a buffer unit of the third page buffer during the second operation mode.

16. The semiconductor memory device of claim 8, wherein the first page buffer includes:
   a page buffer control circuit to set an output of a page buffer, connected to a defective memory cell or bit line, to fixed data, and
   wherein the page buffer control circuit inhibits writing from the first data bus when a memory cell or a bit line is defective.

17. The semiconductor memory device of claim 8, wherein the third page buffer includes a repair information storing unit to store identification data indicating whether a page buffer unit of either one of the first and second page buffers is repaired.

18. The semiconductor memory device of claim 17, further comprising:
   a column repair selecting unit to connect the buffer unit of the third page buffer to an ECC data bus to perform a read or an ECC data bus to perform a write in response to the identification data.

19. The semiconductor memory device of claim 6, wherein the first data bus is an ECC bus.

20. A semiconductor memory device, comprising:
   a data transfer unit including a first page buffer to store normal data, a second page buffer to store parity data, and a third page buffer that is replaced together with one of normal data when the stored normal data is defective and parity data when the stored parity data is defective; and
   a repair circuit used in common when a defective page buffer unit in the first and second page buffers is repaired with a page buffer unit in the third page buffer.

* * * * *